(12) United States Patent
Inbasekaran et al.

(10) Patent No.: US 6,916,902 B2
(45) Date of Patent: Jul. 12, 2005

(54) TRICYCLIC ARYLAMINE CONTAINING POLYMERS AND ELECTRONIC DEVICES THEREFROM

(75) Inventors: Michael Inbasekaran, Midland, MI (US); Yang Cheng, Saginaw, MI (US); Scott Gaynor, Midland, MI (US); Michelle L. Hudack, Grand Blanc, MI (US); Chun Wang, Midland, MI (US); Dean M. Welsh, Midland, MI (US); Weishi Wu, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 60 days.

(21) Appl. No.: 10/324,270

(22) Filed: Dec. 19, 2002

(65) Prior Publication Data

US 2004/0127666 A1 Jul. 1, 2004

(51) Int. Cl.$^7$ .............................................. C08G 61/00
(52) U.S. Cl. .................. 528/397; 528/451; 528/422; 528/423; 528/82; 428/421; 428/690; 428/917; 427/407.1; 313/504
(58) Field of Search ................................. 528/397, 401, 528/422, 423, 82; 428/421, 690, 917; 427/407.1; 313/504

(56) References Cited

U.S. PATENT DOCUMENTS

| | | | |
|---|---|---|---|
| 4,769,292 A | 9/1988 | Tang et al. | 428/690 |
| 5,247,190 A | 9/1993 | Friend et al. | 257/40 |
| 5,399,502 A | 3/1995 | Friend et al. | 437/1 |
| 5,621,131 A | 4/1997 | Kreuder et al. | 558/46 |
| 5,679,760 A | 10/1997 | Mullen et al. | 528/220 |
| 5,682,043 A | 10/1997 | Pei et al. | 257/40 |
| 5,708,130 A | 1/1998 | Woo et al. | 528/397 |
| 5,728,801 A | 3/1998 | Wu et al. | 528/422 |
| 5,777,070 A | 7/1998 | Inbasekaran et al. | 528/394 |
| 5,807,974 A | 9/1998 | Kim et al. | 528/366 |
| 5,814,244 A | 9/1998 | Kreuder et al. | 252/301.16 |
| 5,858,563 A | 1/1999 | Sano et al. | 428/690 |
| 5,874,179 A | 2/1999 | Kreuder et al. | 428/690 |
| 5,876,864 A | 3/1999 | Kim et al. | 428/690 |
| 5,879,821 A | 3/1999 | Hsieh | 428/690 |
| 5,900,327 A | 5/1999 | Pei et al. | 428/690 |
| 5,929,194 A | 7/1999 | Woo et al. | 528/229 |
| 5,998,045 A | 12/1999 | Chen et al. | 428/690 |

FOREIGN PATENT DOCUMENTS

| | | |
|---|---|---|
| EP | 0 707 020 A2 | 4/1996 |
| FR | 2702870 | 9/1994 |
| WO | 95/01871 | 1/1995 |
| WO | 97/05184 | 2/1997 |
| WO | 97/33193 | 9/1997 |
| WO | 97/39045 | 12/1997 |
| WO | 97/46052 | 12/1997 |
| WO | 01/81294 A1 | 11/2001 |

OTHER PUBLICATIONS

Hubert et al., Partially conjugated polymers containing fluorene residues and their use, 2000, Aventis Research and Technologies GmbH and Co. KG, Germany, Chem Abstract 132: 254071.*

(Continued)

*Primary Examiner*—Duc Truong
(74) *Attorney, Agent, or Firm*—Susan Moeller Zerull

(57) ABSTRACT

A composition comprising a polymer comprising a repeat unit of Formula I:

Formula I

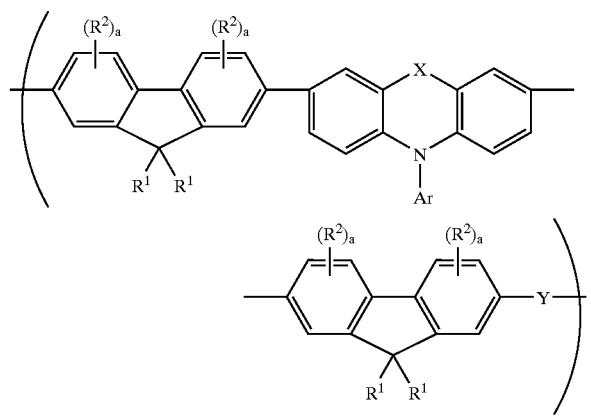

wherein $R^1$ is independently in each occurrence H, $C_{1-40}$ hydrocarbyl or $C_{3-40}$ hydrocarbyl containing one or more S, N, O, P or Si atoms, or both of $R^1$ together with the 9-carbon on the fluorene, may form a $C_{5-20}$ ring structure which may contain one or more S, N, or O atoms;

$R^2$ is independently in each occurrence $C_{1-20}$ hydrocarbyl, $C_{1-20}$ hydrocarbyloxy, $C_{1-20}$ thioether, $C_{1-20}$ hydrocarbyloxycarbonyl, $C_{1-20}$ hydrocarbylcarbonyloxy, or cyano;

a is independently in each occurrence, 0 or 1;

X is O, S, $SO_2$, $C(R^3)_2$ or N—$R^3$ wherein $R^3$ is aryl or substituted aryl of $C_6$ to $C_{40}$, aralkyl of $C_6$ to $C_{24}$, or alkyl of $C_1$ to $C_{24}$. Preferably $R^3$ is aryl of $C_6$ to $C_{24}$ and more preferably $R^3$ is an alkylated aryl group of $C_6$ to $C_{24}$;

Ar is an aryl or heteroaryl group of $C_6$ to $C_{40}$ or substituted aryl or heteroaryl group of $C_6$ to $C_{40}$, preferably $C_6$–$C_{24}$, and most preferably $C_6$–$C_4$. Y is a conjugated moiety that can vary in each occurrence of the repeat unit.

24 Claims, No Drawings

OTHER PUBLICATIONS

"Blue and Green Light Emission from New Soluble Alternating Copolymers," Cho, et al., *Advanced Materials*, 1997, vol. 9, No. 4, pp. 326–328.

"Blue Electroluminescent 1,2,4–Triazole Derivative," Kido, et al., *Chemistry Letters*, 1996, pp. 47–48.

"Blue light–emitting organic electroluminescent device," Adachi, et al., *Appl. Phys: Lett.*, 1990, vol. 56 (9), pp. 799–801.

"Carrier transport in a three–layered electroluminescent device," Ohmori, et al., *J. phys. D: Appl. Phys.*, 1996, vol. 29, pp. 2983–2987.

"Characterization of an Emissive Polymer Blend on LED," Kim, et al., *Polym. Prepr.*, 1997, vol. 38, No. 1 pp. 417–418.

"Color–Variable Electroluminescent Diode with Single Well Structure Utilizing 8–Hydroxyquinoline Aluminum and Aromatic Diamine," Fuji, et al., Jpn. J. Appl. Phys., 1995, vol. 34, Part 2, No. 4B, pp. L499–L502.

"Coupling of Aryl Chlorides by Nickel and Reducing Metals," Colon, et al., *J. Org. Chem.*, 1986, vol. 51, No. 14, pp. 2627–2637.

"Design and Application of Electron–Transporting Organic Materials," Strukelj, et al., 1995, vol. 267, pp. 1969–1972.

"Efficient blue–green and white light–emitting electrochemical cells based on poly[9,9–bis(3,6–dioxaheptyl)–fluorene–2,7–diyl]," Yang, et al., *J. Appl. Phys.*, 1997, vol. 81, No. 7, pp. 3294–3298.

"Electrically Conducting and Thermally Stableπ–Conjugated Polyarylenes Prepared By Organometallic Processes," Yamamoto, *Prog. Polym. Sci.*, 1992, vol. 17, pp. 1153–1205.

"Electroluminescence applications of a poly(phenyl quinoxaline)," O'Brien, et al., *Synthetic Metals*, 1996, vol. 76, pp. 105–108.

"Electroluminescence of doped organic thin films," Tang, et al., *J. Appl. Phys.*, 1989. vol. 65, No. 9, pp. 3610–3616.

"Electron Injection polymer for polymer light–emitting diodes," Yang, et al. *J. Appl. Phys.*, 1995, vol. 77, No. 9, pp. 4807–4809.

"Enhancement of Emission Efficiency in Electroluminescent Diode Utilizing Vapor–Deposited Poly(alkylfluorence)," Ohmori, et al, *Jpn. J. Appl. Phys.*, 1993, vol. 32, pp. L1663–L1666.

"Fusible Conducting Poly(9–alkylfluorene) and Poly(9, 9–dialkylfluorene) and Their Characteristics," Fukuda, et al., *Japanese Journal of Applied Physics*, 1989, vol. 28, No. 8, pp. L1433–L1435.

"High brightness and efficiency blue light–emitting polymer diodes," Grice, et al., *Applied Physics Letters*, 1998, vol. 73, No. 5, pp. 629–631.

"High Luminance in Organic Electroluminescent Devices with Bis(10–hydroxybenzol[h]quinolinato)berylium as an Emitter," Hamada, et al., *Chemistry Letters*, 1993, pp. 905–906.

"High Molecular Weight Aromatic Polymers by Nickel Coupling of Aryl Polychlorides," Colon, et al., *Journal of Polymer Science: Part A: Polymer Chemistry*, 1990, vol. 28, pp. 367–38.

"Highly Efficient and Accelerated Suzuki Aryl Couplings Mediated by Phosphine–Free Sources," Wallow,, et al., *J. Org. Chem.*, 1994, vol. 59, pp. 5034–5037.

"Homocoupling of Aryl Halides Using Nickel(II) Complex and Zinc in the Presence of EtHD $_4$NI. An Efficient Method for the Synthesis of Biaryls and Bipyridines[1] .," Iyoda, et al., *Bull. Chem. Soc. Jpn.*, 1990, vol. 60, No. 1, pp. 80–87.

"Metal ion dependnet luminescence effects in metal tris-–quinolate organic heterojunction light emitting devices," Burrows, et al., *Appl. Phys. Lett.*, 1994, vol. 64, No. 20, pp. 2718–2720.

"Organic Electroluminescent Devices," Sheats, et al., *Science*, 1996, vol. 273, pp. 884–888.

"Organic Electroluminescent Devices with Bright Blue Emission," Hamada, et al., *Optoelectronics—Devices and Technology*, 1992, vol. 7, No. 1, pp. 83–93.

"Organic electroluminescent diodes," Tang, et al., *Appl. Phys. Lett.*, 1987, vol. 51, No. 12, pp. 913–915.

"Palladium–Catalyzed Cross–Coupling Reactions of Organoboron Compounds," Miyaura, et al., *Chem Rev.*, 1995, vol. 95, pp. 2457–2483.

"Recent progress in polymers for electroluminescence: microcavity devices and electron–transport polymers," Weaver, et al., *Thin Solid Films*, 1996, vol. 273, pp. 39–47.

"Synthesis and Characterization of a Soluble Blue Light Emitting Alternating Copolymer," Cho, et al., *Macromol. Symp.*, 1997, vol. 125, pp. 133–142.

"Synthesis of Fusible and Soluble Conducting Polyfluorene Derivatives and Their Characteristics," Fukuda, et al., *Journal of Polymer Science: Part A: Polymer Chemistry*, 1993, vol. 31, pp. 2465–2471.

"Synthesis optical absorption and fluorescence of new poly(p–phenylene)–related polymers," Remmers, et al., *Macromol. Rapid Commun.*, 1996, vol. 17, pp. 239–252.

"The Palladium–Catalyzed Cross–Coupling Reaction of Phenylbornic Acid With Haloarenes in the Presence of Bases," Miyaura, et al., 1981, vol. 11, No. 7, pp. 513–519.

"Three–layered multicolor organic electroluminescent device," et al., *Appl. Phys. Lett.*, 1996, vol. 69, No. 6, pp. 734–736.

"Trap–Controlled Hopping Transport," *J. Phys. Chem.*, 1984, vol. 88, pp. 4714–4717.

Ohomori, et al., *Jpn. J. of Appl. Phys.*, 1991, vol. 30, No. 11B, pp. 1941–1943.

"Highly Efficient LEDs based on Fluorene Polymers," Woo, et al., *MRS Meeting Presentation*, Apr. 13, 1998.

Larmat, et al., *Amer. Chem. Soc.*, 1997, vol. 37, No. 1, pp. 799–800.

LeDelt, et al., *Synthetic Metal*, 1992, vol. 47, pp. 373–376.

Li, et al., *Journal of Chemical Society*,1995, pp. 2211–2212.

Yamamoto, et al., *Japan Journal of Applied Physics*, 1994, vol. 33, pp. L250–L253.

Shine, HJ; WU, S–M: "Ion Radicals. 44. Reactions with 10–phenylphenoxazine cation radical perchlorate" J. Org. Chem., vol. 44, No. 19, 1979, pp. 3310–3316, XP002275205, p. 3311.

Jovanovic, MV; Biehl, ER: "Bromination of 10–phenylphenothiazine and 1–phenylphenoxazine", J. Org. Chem., vol. 49, 1084, pp. 1905–1908, XP002275206 the whole document.

Database CA Online! Chemical Abstracts Service, Columbus, Ohio, US; Feb. 17, 1969 (Feb. 17, 1969) Roushdi, I.M. et al.: "Chemical studies on some ataractic drugs. 11", Database accession No. 70:28881 XP002275207 abstract.
Patent Abstracts of Japan vol. 2002, No. 07, Jul. 3, 2002 (Jul. 3, 2002) & JP 2002 069161 A (National Institute of Advanced Industrial & Technology), Mar. 8, 2002 (Mar. 8, 2002) abstract.

* cited by examiner

TRICYCLIC ARYLAMINE CONTAINING POLYMERS AND ELECTRONIC DEVICES THEREFROM

This invention was made with United States Government support under Cooperative Agreement No. N00421-98C-1187 awarded by NIST. The United States Government has certain rights in the invention.

This invention relates to polymeric compositions comprising tricyclic arylamines and electronic devices comprising such compositions.

BACKGROUND

Fluorene based conjugated polymers are known to have optoelectronic properties. Several reports have demonstrated blue light emission from fluorene homopolymers e.g., A. W. Grice; D. D. C. Bradley, M. T. Bernius; M. Inbasekaran, W. Wu, E. P. Woo; Appl. Prep. Lett. 1998, 73, Y. Young and Q. Pei; J. Appl. Prep. 81, 3294(1997).

Attempts have been made to modify fluorene containing polymers to increase device efficiency. Attempts have also been made to control an undesired red shift in emission of polyfluorene based devices.

WO 01/81294 A1 teaches a fluorene polymer that is end-capped with a charge transporting tricyclic arylamine. That reference states that end-capping with at least one charge transporting moiety provides advantages. The purported advantages include higher efficiency and color stability without alteration of the electronic properties of the polyfluorene polymer main chain. The reference also states that approaches that include chemical moieties incorporated into the polyfluorene main chain or the copolymerization with other monomers inevitably modify essential properties of the main chain.

U.S. Pat. No. 5,874,179 (Kreuder et al) teaches optoelectronic polymers based on polyphenylenevinylene with nitrogen containing comonomers. Additionally, Kreuder further teaches that fluorene could be part of a fused nitrogen containing ring structure in a polyphenylenevinylene based polymer.

U.S. Pat. No. 5,879,821 (Hsieh) teaches polymers containing repeat units of two tricyclic arylamines which are either bonded together or are arranged in a bis structure on either side of a divalent atom or moiety "G". G can be O, S, N-Phenyl, vinylene, acetylene, p-phenylene, m-phenylene, o-phenylene, or —CH=CH—Phenyl —CH=CH—. A wide variety of additional units may be used with the two tricyclic aryl amine repeat units. Fluorene is included in a long list of additional units. However, Hsieh does not provide data relating to devices containing polymers of fluorene containing repeat units. Rather, the patent provides examples of devices based on acyclic triarylamine containing repeat units. The devices in Hsieh's examples are activated at very high voltages of 25V and 30 V.

A need remains for optoelectronic materials and devices that exhibit good conductivity, improved efficiency, emit a variety of colored light and have high brightness at low drive voltages.

SUMMARY OF INVENTION

Surprisingly, the present inventors have discovered that the inclusion of tricyclic arylamine in the main chain of a fluorene based optoelectronic polymer provides remarkably improved conductivity at low voltages as well as higher device efficiency compared to polyfluorenes having other charge transporting groups such as acyclic triarylamines.

Thus, in a first embodiment, the invention is a composition comprising a polymer comprising a repeat unit of Formula I:

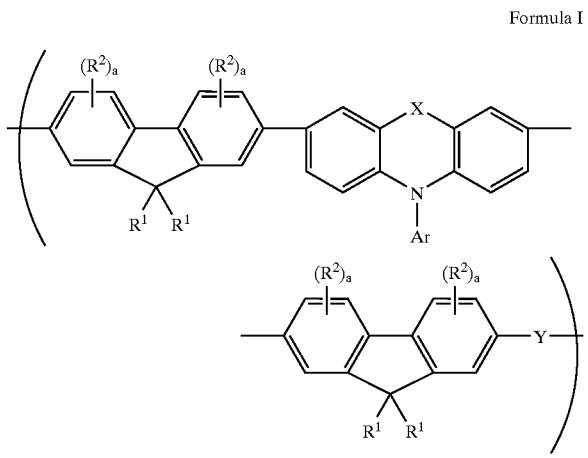

Formula I wherein $R^1$ is independently in each occurrence H, $C_{1-40}$ hydrocarbyl or $C_{3-40}$ hydrocarbyl containing one or more S, N, O, P or Si atoms, or both of $R^1$ together with the 9-carbon on the fluorene, may form a $C_{5-20}$ ring structure which may contain one or more S, N, or O atoms;

$R^2$ is independently in each occurrence $C_{1-20}$ hydrocarbyl, $C_{1-20}$ hydrocarbyloxy, $C_{1-20}$ thioether, $C_{1-20}$ hydrocarbyloxycarbonyl, $C_{1-20}$ hydrocarbylcarbonyloxy, or cyano;

a is independently in each occurrence, 0 or 1;

X is O, S, $SO_2$, $C(R^3)_2$ or N-$R^3$ wherein $R^3$ is aryl or substituted aryl of $C_6$ to $C_{40}$, aralkyl of $C_6$ to $C_{24}$, or alkyl of $C_1$ to $C_{24}$. Preferably $R^3$ is aryl of $C_6$ to $C_{24}$ and more preferably $R^3$ is an alkylated aryl group of $C_6$ to $C_{24}$.

Ar is an aryl or heteroaryl group of $C_6$ to $C_{40}$ or substituted aryl or heteroaryl group of $C_6$ to $C_{40}$, preferably $C_6$–$C_{24}$, and most preferably $C_6$–$C_4$. Y is a conjugated moiety that can vary in each occurrence of the repeat unit.

In another aspect, the invention is an optoelectronic active polymer that is the reaction product of a mixture comprising a fluorene diboronate monomer, a dihalogenated tricyclic arylamine monomer and optionally one or more dihalogenated conjugated monomers.

In another aspect, the invention is a polymer of the invention in a solvent.

In another aspect, the invention is a polymer of the invention blended with at least one other fully conjugated polymer.

In another aspect, the invention is a polymeric light emitting diode comprising a polymer of the instant invention.

In another aspect, the invention is a photocell comprising a polymer of the instant invention.

In another aspect, the invention is a field effect transistor comprising a polymer of the invention.

In another aspect, the invention is a composition of the formula:

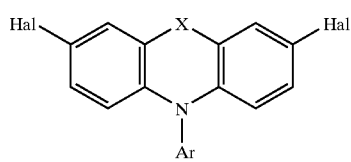

where X is O, S, SO$_2$, C(R$^3$)$_2$ or N—R$^3$ wherein R$^3$ is aryl or substituted aryl of C$_6$–C$_{40}$, aralkyl of C$_6$–C$_{24}$, or alkyl of C$_1$–C$_{24}$. Preferably R$^3$ is aryl of C$_6$–C$_{24}$ and more preferably R$^3$ is an alkylated aryl group of C$_6$–C$_{24}$. Ar is an aryl or heteroaryl group of C$_6$–C$_{40}$ or substituted aryl or heteroaryl group of C$_6$–C$_{40}$. Preferably, the aryl, heteroaryl or substituted aryl or heteroaryl group is C$_6$–C$_{24}$. Hal is a halogen. Preferably, Hal is F, Cl, Br and I. More preferably, Hal is Br or I. Most preferably, Hal is Br.

DETAILED DESCRIPTION OF THE PREFERRED EMBODIMENTS

In a preferred embodiment, the invention is a composition comprising a polymer comprising a repeat unit of Formula I:

Formula I

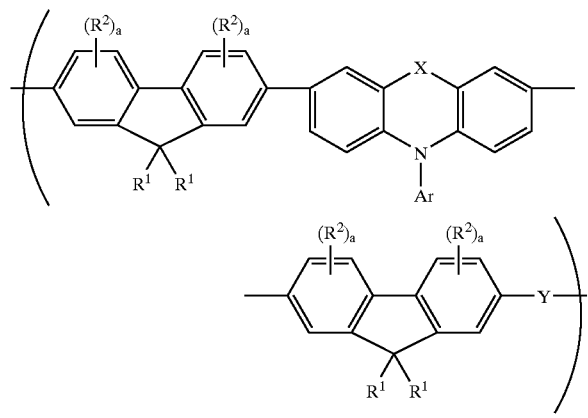

R$^1$ is independently in each occurrence H, C$_{1-40}$ hydrocarbyl or C$_{3-40}$ hydrocarbyl containing one or more heteroatoms of S, N, O, P or Si. Alternatively, both of R$^1$ together with the 9-carbon on the fluorene may form a C$_{5-20}$ aliphatic or aromatic ring structure or a C$_{4-20}$ aliphatic or aromatic ring structure which may contain one or more heteroatoms of S, N, or O. Preferably R$^1$ is C$_{1-12}$ alkyl, C$_{6-10}$ aryl, C$_{6-40}$ hydrocarbyloxyaryl or alkyl-substituted aryl, C$_{4-16}$ hydrocarbyl carboxylate or C$_{9-16}$ aryl trialkylsiloxy moiety. More preferably R$^1$ is C$_{4-10}$ alkyl or C$_{6-40}$ hydrocarbyloxyaryl.

In the embodiment where the two R$^1$ form a ring structure with the 9-carbon atom of the fluorene ring, the ring structure formed is preferably a C$_{5-10}$ straight- or branched-ring structure or a C$_{4-20}$ straight- or branched-chain ring structure containing one or more heteroatoms of S, N or O; even more preferably a C$_{5-10}$ aliphatic or aromatic ring or a C$_{4-10}$ aliphatic or aromatic ring containing one or more of S or O; and most preferably a C$_{5-10}$ cycloalkyl or C$_{4-10}$ cycloalkyl containing oxygen.

R$^2$ is independently in each occurrence C$_{1-20}$ hydrocarbyl, C$_{1-20}$ hydrocarboxyloxy, C$_{1-20}$ thioether, C$_{1-20}$ hydrocarbyloxycarbonyl, C$_{1-20}$ hydrocarbylcarbonyloxy or cyano. R$^2$ is preferably C$_{1-12}$ alky, C$_{6-10}$ aryl or alkyl-substituted aryl, C$_{6-10}$ aryloxy or alkyl-substituted aryloxy, C$_{1-12}$ alkoxycarbonyl, C$_{6-10}$ arloxycarbonyl or alkyl-substituted aryloxycarbonyl, C$_{1-12}$ alkoxy, C$_{1-12}$ alkylcarbonyloxy, C$_{6-10}$ arylcarbonyloxy or alkyl-substituted arylcarbonyloxy, cyano or C$_{1-20}$ alkylthio. Even more preferably, R$^2$ is C$_{1-4}$ alkoxy, phenoxy, C$_{1-4}$ alkyl, phenol, sulfone or cyano.

"a" is independently in each occurrence from about 0 to 1. Preferably, a is 0.

The term "hydrocarbyl" as used herein means any organic moiety containing only hydrogen and carbon unless specified otherwise, and may include aromatic, aliphatic, cycloaliphatic and moieties containing two or more alphatic, cycloaliphatic and aromatic moieties.

X is preferably O, S, SO$_2$, C(R$^3$)$_2$ or N—R$^3$.

R$^3$ is aryl of C$_6$ to C$_{40}$ or substituted aryl of C$_6$ to C$_{40}$, aralkyl of C$_6$ to C$_{24}$, or alkyl of C$_1$ to C$_{24}$. Preferably R$^3$ is aryl of C$_6$ to C$_{24}$ and more preferably R$^3$ is an alkylated aryl group of C$_6$ to C$_{24}$.

Ar is an aryl or heteroaryl group of C$_6$ to C$_{40}$ or substituted aryl or heteroaryl group of C$_6$ to C$_{40}$. Preferably, the aryl, heteroaryl or substituted aryl or heteroaryl group is C$_6$–C$_{24}$, and more preferably C$_6$–C$_{14}$. Most preferably Ar is phenyl, alkylated phenyl, 2-fluorenyl, anthracenyl, phenantherenyl, pyrenyl, pyridine, isoquinoline, quinoline, triazine, triazole, benzotriazole, or phenanthridine.

Y is a conjugated unit that can vary in each occurrence of the repeat unit.

The term "repeat unit" means a series of conjugated units bonded together in a specific order which are present in a polymer at least twice.

The term "conjugated unit" means a moiety containing overlapping π orbitals.

In a preferred embodiment, additional conjugated units including hole transporting moieties, electron transporting moieties, and/or light emitting moieties are present. The additional units are used to optimize one or more of the following: charge injection, charge transport, electroluminescent device efficiency and lifetime. In this preferred embodiment, the conjugated unit Y is selected from the group consisting of conjugated units of the formulas:

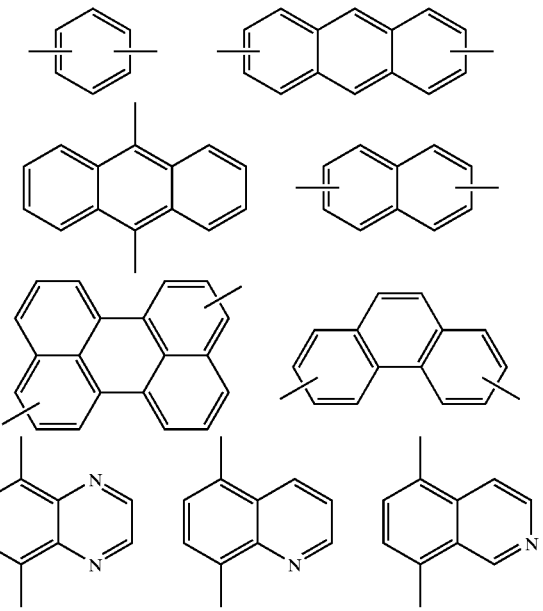

-continued

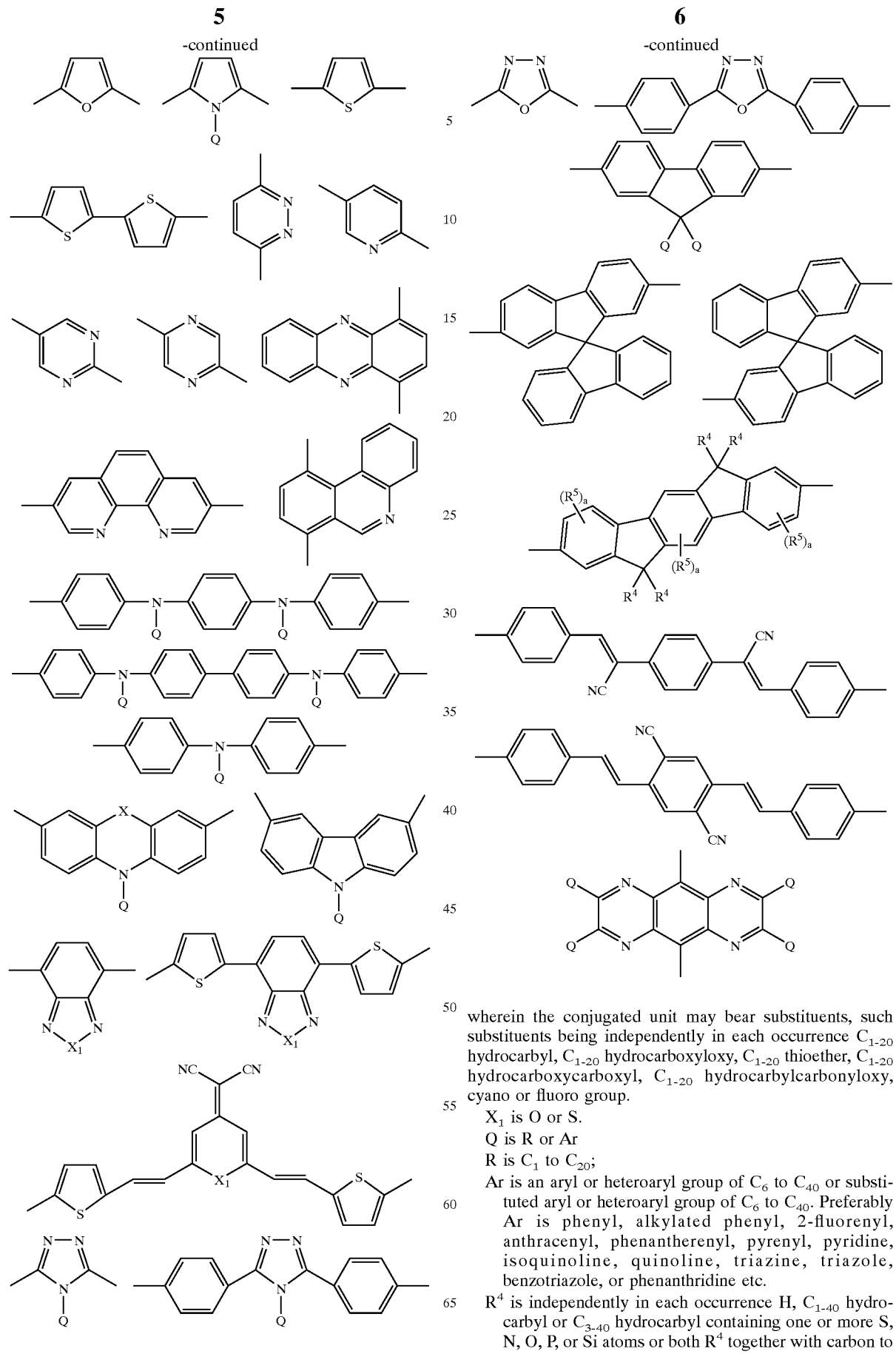

wherein the conjugated unit may bear substituents, such substituents being independently in each occurrence $C_{1-20}$ hydrocarbyl, $C_{1-20}$ hydrocarboxyloxy, $C_{1-20}$ thioether, $C_{1-20}$ hydrocarboxycarboxyl, $C_{1-20}$ hydrocarbylcarbonyloxy, cyano or fluoro group.

$X_1$ is O or S.
Q is R or Ar
R is $C_1$ to $C_{20}$;
Ar is an aryl or heteroaryl group of $C_6$ to $C_{40}$ or substituted aryl or heteroaryl group of $C_6$ to $C_{40}$. Preferably Ar is phenyl, alkylated phenyl, 2-fluorenyl, anthracenyl, phenantherenyl, pyrenyl, pyridine, isoquinoline, quinoline, triazine, triazole, benzotriazole, or phenanthridine etc.
$R^4$ is independently in each occurrence H, $C_{1-40}$ hydrocarbyl or $C_{3-40}$ hydrocarbyl containing one or more S, N, O, P, or Si atoms or both $R^4$ together with carbon to which both $R^4$ are bonded may form a $C_{5-20}$ ring structure which may contain one or more S, N, or O atoms. $R^5$ is independently $C_{1-20}$ hydrocarbyl, $C_{1-20}$ hydrocarbyloxy, $C_{1-20}$ thioether, $C_{1-20}$ hydrocarbyloxycarbonyl, $C_{1-20}$ hydrocarbylcarbonyloxy or cyano.

In a preferred embodiment, the invention is a composition comprising a polymer comprising a repeat unit of Formula I further comprising a repeat unit of Formula II:

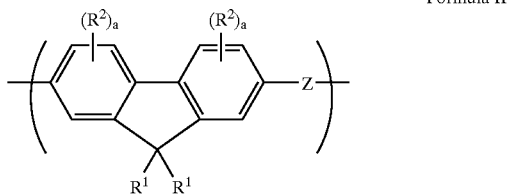

Formula II wherein $R_1$ is independently in each occurrence H, $C_{1-40}$ hydrocarbyl or $C_{3-40}$ hydrocarbyl containing one or more heteroatoms of S, N, O, P or Si. Alternatively, both of $R^1$ together with the 9-carbon on the fluorene may form a $C_{5-20}$ aliphatic or aromatic ring structure or a $C_{4-20}$ aliphatic or aromatic ring structure which may contain one or more heteroatoms of S, N, or O. Preferably $R^1$ is $C_{1-12}$ alkyl, $C_{6-10}$ aryl or alkyl-substituted aryl, $C_{4-16}$ hydrocarbyl carboxylate or $C_{9-16}$ aryl trialkylsiloxy moiety. More preferably $R^1$ is $C_{4-10}$ alkyl or $C_{6-40}$ hydrocarbyloxyaryl.

In the embodiment where the two $R^1$ form a ring structure with the 9-carbon atom of the fluorene ring, the ring structure formed is preferably a $C_{5-20}$ straight- or branched-ring structure or a $C_{4-20}$ straight- or branched-chain ring structure containing one or more heteroatoms of S, N or O; even more preferably a $C_{5-10}$ aliphatic or aromatic ring or a $C_{4-10}$ aliphatic or aromatic ring containing one or more of S or O; and most preferably a $C_{5-10}$ cycloalkyl or $C_{4-10}$ cycloalkyl containing oxygen.

$R^2$ is independently in each occurrence $C_{1-20}$ hydrocarbyl, $C_{1-20}$ hydrocarbyloxy, $C_{1-20}$ thioether, $C_{1-20}$ hydrocarbyloxycarbonyl, $C_{1-20}$ hydrocarbylcarbonyloxy or cyano. $R^2$ is preferably $C_{1-12}$ alkyl, $C_{6-10}$ aryl or alkyl-substituted aryl, $C_{6-10}$ aryloxy or alkyl-substituted aryloxy, $C_{1-12}$ alkoxycarbonyl, $C_{6-10}$ arloxycarbonyl or alkyl-substituted aryloxycarbonyl, $C_{1-12}$ alkoxy, $C_{1-12}$ alkylcarbonyloxy, $C_{6-10}$ arylcarbonyloxy or alkyl-substituted arylcarbonyloxy, cyano or $C_{1-20}$ alkylthio. Even more preferably, $R^2$ is $C_{1-4}$ alkoxy, phenoxy, $C_{1-4}$ alkyl, phenol, sulfone or cyano.

"a" is independently in each occurrence from about 0 to 1. Preferably, a is 0.

Z is independently in each occurrence a conjugated moiety selected from the formulas from which Y above can be selected.

Based on the above formulas, an additional aspect of the invention are polymers that emit light across the entire visible spectrum including white light emission.

The polymers of the invention preferably have a weight average molecular weight of about 10,000 Daltons or greater, more preferably 20,000 Daltons or greater, even more preferably 50,000 Daltons or greater; preferably 1,000,000 Daltons or less, more preferably 500,000 Daltons or less, and most preferably 400,000 Daltons. Molecular weights are determined using gel permeation chromotography using polystyrene as an internal standard.

Preferably, the polymers demonstrate a polydispersity (Mw/Mn) of 10 or less, more preferably 5 or less, even more preferably 4 or less and most preferably 3 or less.

The polymers and copolymer blends of the invention demonstrate strong photoluminescence in dilute solutions or in the solid state. When such materials are exposed to a light of a wavelength of 360–500 nanometers (nm), the materials emit light of wavelengths in the region of 400–700 nm. More preferably, such materials absorb light of wavelengths of from 380–450 nm and emit light of wavelengths 420–680 nm.

Synthesis

The polymers of this invention may be assembled by any known coupling reaction for making aromatic compounds. Preferably, the Suzuki coupling reaction is used. The Suzuki reaction couples aromatic compounds using a diboronated aromatic moiety and a dihalogenated aromatic moiety. The reaction allows for the creation of long chain, high molecular weight polymers. Additionally, by controlling the sequence of addition, either random or block copolymers may be produced.

Preferably, the Suzuki reaction starts with a diboronated fluorene monomer or diboronated substituted fluorene monomer and a dihalogenated conjugated monomer having the formula:

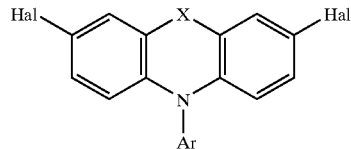

Where X is O, S, $SO_2$, $C(R^3)_2$ or N—$R^3$ wherein $R^3$ is aryl of $C_6$ to $C_{40}$ or substituted aryl of $C_6$ to $C_{40}$, aralkyl of $C_6$ to $C_{24}$, or alkyl of $C_1$ to $C_{24}$. Preferably $R^3$ is aryl of $C_6$ to $C_{24}$ and more preferably $R^3$ is an alkylated aryl group of $C_6$ to $C_{24}$; and Ar is an aryl or heteroaryl group of $C_6$ to $C_{40}$ or substituted aryl or heteroaryl group of $C_6$ to $C_{40}$. Hal is a halogen. Preferably, Hal is F, Cl, Br and I. More preferably, Hal is Br and I. Most preferably, Hal is Br.

Optionally, additional dihalogenated conjugated monomers may be used. The polymer structure will have the structure fluorene-conjugated monomer, fluorene-conjugated monomer, etc.

Optionally, a conjugated dihalogenated moiety such as dihalogenated versions of phenylenediamine, substituted phenylenediamine, benzidine, substituted benzidine, triarylamine, substituted triarylamine, benzothiadiazole, thiophene, bis-thiophene-benzothiadiazole, dicyanovinylenepyran or thiopyran may also be used.

The Suzuki process is taught in U.S. Pat. No. 5,777,070, which is expressly incorporated herein by reference.

Toluene or xylenes are the preferred solvents for the Suzuki reaction to prepare the polymers of the instant invention. Sodium carbonate in water is the preferred base, tetrakis(triphenylphosphine)palladium is the preferred catalyst, and a phase transfer catalyst preferably a quartemary ammonium salt is used to speed up the reaction for achieving high molecular weight in a short period of time. Tricyclic amines unsubstituted on the nitrogen atom are commercially available from many commercial vendors including Aldrich Chemical Company. Aryl substituted tricyclic amines are produced through the reaction of a N-unsubstituted prescursor with a brominated or iodinated aryl or substituted aryl compound. The ratio of diarylamine to bromoaryl or iodoaryl or substituted bromo or iodo aryl is 1 to 1.2–2. The materials are reacted in the presence of a catalyst. Preferably, the catalyst is palladium acetate and tri-o-tolylphosphine. Preferably, sodium tert-butoxide may be used as the base. The materials are heated and refluxed for about 15 hours at 80–110° C. in toluene. The solution is cooled. Tricyclic amine is isolated and further brominated with bromination techniques known to those skilled in the art. The most preferred brominating agent is N-bromosuccinimide in a solvent such as DMF, methylene chloride, etc.

Polymer Blends

Another aspect of this invention is related to polymer blends. The blends comprise a polymer containing repeat units of Formula I or Formula I and Formula II blended with at least one other conjugated polymer. As used herein, the term "conjugated polymer" means a polymer with a backbone of overlapping π orbitals. Conjugated polymers that may be used in the blends include polyflourenes, poly (arylenevinylene), polyphenylenes, polyindenofluorenes and polythiophenes, including homopolymers, co-polymers or substituted homopolymers and/or copolymers of any of these conjugated polymers.

Preferably the polymer blend is composed of at least 10 percent of a polymer containing units of Formula I or Formula I and Formula II and 90 percent of another conjugated polymer. Preferably the band gap of the conjugated polymer is narrower than the band gap of polymer containing units of Formula I or Formula I and Formula II. The most preferred polymer blends have high photoluminescent and electroluminescent efficiency. Other additives such as viscosity modifiers, antioxidants and coating improvers may optionally be added. Additionally, blends of two or more low polydispersity polymers of similar compositions but different molecular weight can also be formulated.

Films

Another aspect of this invention is the films formed from the polymers of the invention. Such films can be used in polymeric light emitting diodes, photovoltaic cells and field effect transistors. Preferably such films are used as emitting layers or charge carrier transport layers. The films may also be used as protective coatings for electronic devices and as fluorescent coatings. The thickness of the film or coating is dependent upon the use.

Generally, such thickness can be from 0.005 to 200 micron. When the coating is used as a fluorescent coating, the coating or film thickness is from 50 to 200 microns. When the coatings are used as electronic protective layers, the thickness of the coating can be from 5 to 20 microns. When the coatings are used in a polymeric light-emitting diode, the thickness of the layer formed is 0.005 to 0.2 microns. The polymers of the invention form good pinhole and defect-free films.

The films are readily formed by coating the polymer composition from another embodiment of this invention in which the composition comprises the polymer and at least one organic solvent. Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetramethyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, dimethylformamide, 2-chloro-6fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylansiole, 3-methylanisole, 4-fluoro-3-methylanisole, 2-fluorobenzonitrile, 4-fluoroveratrol, 2,6-dimethylanisole, 3-fluorobenzonitrile, 2,5-dimethylanisole, 2,4-dimethylanisole, benzonitrile, 3,5-dimethylanisole, N,N-dimethylaniline, ethyl benzoate, 1-fluoro-3,5-dimethoxybenzene, 1-methylnaphthalene, N-methylpyrrolidinone, 3-fluorobenzotrifluoride, benzotrifluoride, benzotrifluoride, diosane, trifluoromethoxybenzene, 4-fluorobenzotrifluoride, 3-fluoropyridine, toluene, 2-fluorotoluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluorobenzene, 3-chlorofluorobenzene, 1-chloro-2,5-difluorobenzene, 4-chlorofluorobenzene, chlorobenzene, o-dichlorobenzene, 2-chlorofluorobenzene, p-xylene, m-xylene, o-xylene or mixture of o-, m-, and p-isomers. It is preferable that such solvents have relatively low polarity. High boilers and solvent mixtures are better for ink jetting, but xylenes and toluene are best for spin coating. Preferably the solution contains from about 1 to 5 percent of a polymer comprising a repeat unit of Formula I and/or a repeat unit of Formula I and a repeat unit of Formula II.

Films can be prepared by means well known in the art including spin-coating, spray-coating, dipcoating, roll-coating, offset printing, ink jet printing, screen printing, stamp-coating or doctorblading.

In a preferred embodiment, the invention is a composition comprising a polymer or polymer blend of the invention in a solvent. Solvents which can be used include toluene, xylene, a mixture of o, m and p-isomers of xylene, mesitylene, diethylbenzene, ethylbenzene or benzene derivatives or higher substitute level. Preferably, the solution contains from 0.1 to 10 weight percent of the composition. For thin coatings, it is preferred that the composition contains from 0.5 to 5.0 percent by weight of the composition. The composition is applied to the appropriate substrate by the desired method and the solvent is allowed to evaporate. Residual solvent may be removed by vacuum, heat and/or by sweeping with an inert gas such as nitrogen.

Electroluminesecent Devices

The polymers of this invention demonstrate strong electroluminesence in addition to photoluminesence. Thus, another aspect of the invention relates to organic electroluminescent (EL) devices having a film comprising the polymers of this invention. EL devices based on the polymers of this invention demonstrate improved efficiency over devices in which the electroluminscent polymer film does not contain a repeat unit comprising a tricyclic arnine. Preferably, the EL devices of this invention emit light when subjected to an applied voltage of preferably 20 volts or less, preferably 10 volts or less and most preferably 6 volts or less.

An organic EL device typically consists of an organic film sandwiched between an anode and a cathode. When a positive bias is applied to the device, holes are injected into the organic film from the anode, and electrons are injected into the organic film from the cathode. The combination of a hole and an electron may give rise to an exciton that may undergo radiative decay to the ground state by liberating a photon.

In practice, the anode is commonly a mixed oxide of tin and indium for its conductivity and transparency. The mixed oxide (ITO) is deposited on a transparent substrate such as glass or plastic so that the light emitted by the organic film may be observed. The organic film may be the composite of several individual layers each designed for a distinct function. Because holes are injected from the anode, the layer next to the anode should have the functionality of transporting holes. Similarly, the layer next to the cathode should have the functionality of transporting electrons. In many instances, the electron or hole transporting layer may also act as the emitting layer. In some instances, a single layer may perform the combined functions of hole and electron transport and light emission.

The metallic cathode may be deposited either by thermal evaporation or by sputtering. The thickness of the cathode may be from 1 nm to 10,00 nm. The preferred metals are calcium, magnesium, indium, aluminum and barium. A thin layer (1–10 nm) of an alkali or alkaline metal halide, e.g., LiF, NaF, CsF or RbF may be used as a buffering layer between the light emitting polymer and the cathode, calcium, barium, or magnesium. Alloys of these metals may also be used. Alloys of aluminum containing 1 to 5 percent of lithium and alloys of magnesium containing at least 80 percent of magnesium are preferred.

In a preferred embodiment, the electroluminescent device comprises at least one hole injecting polymer film (PEDOT film, for example) and a light-emitting polymer film comprised of the composition of the invention, arranged between an anode material and a cathode material such that under an applied voltage, holes are injected from the anode material into the light emitting polymer via the hole-injecting polymer film and electrons are injected from the cathode material into the light-emitting polymer film when the device is forward biased, resulting in light emission from the light-emitting layer. In another preferred embodiment, layers of hole-transporting polymers are arranged so that the layer closest to the anode has the lowest oxidation potential, with the adjacent layers having progressively higher oxidation potentials. By these methods, electroluminescent devices having relatively high light output per unit voltage may be prepared.

Additional Devices

Another embodiment of the invention relates to photocells comprising one or more of the polymers of the invention wherein the polymers are present as single-layer films or as multiple-layer films, whose combined thickness is in the range of 10 nm to 1000 nm, preferably in the range of 25 nm to 500 nm, most preferably in the range of 50 nm to 300 nm. When two or more polymers are used, they may be deposited separately as distinct layers or deposited as one layer from a solution containing a blend of the desired polymers.

"Photocells" means a class of optoelectronic devices that can convert incident light energy into electrical energy. Examples of photocells are photovoltaic devices, solar cells, photodiodes, and photodetectors. A photocell generally comprises a transparent or semi-transparent first electrode deposited on a transparent substrate. A polymer film is then formed onto the first electrode that is, in turn, coated by a second electrode. Incident light transmitted through the substrate and the first electrode is converted by the polymer film into excitons that can dissociate into electrons and holes under the appropriate circumstances, thus generating an electric current.

Another embodiment of the invention relates to metal-insulator-semiconductor field effect transistors comprising one or more of the polymers of the invention which serve as a semiconducting polymer. A field effect transistor comprises five elements. The first element is an insulator layer. The insulator layer is an electrical insulator, having a first side and a second side. The second element is a gate. The gate is an electrical conductor. The gate is positioned adjacent the first side of the insulator layer.

The third element is a semiconductor layer. The semiconductor layer comprises a polymer comprising a repeat unit of fluorene or substituted fluorene bonded to a tricyclic arylamine which is then bonded to a fluorene or substituted fluorene which is then bonded to a conjugated moiety. The semiconductor layer has a first side, a second side, a first end and a second end, the second side of the semiconductor layer being adjacent to the second side of the insulator layer. The polymer is deposited onto an insulator wherein the polymers are present as single-layer films or as multiple-layer films whose combined thickness is in the range of 10 mn to 1000 nm, preferably in the range of 25 nm to 500 nm, most preferably in the range of 50 nm to 300 nm.

The fourth element of a field effect transistor is a source. The source is an electrical conductor. The source is in electrical contact with the first end of the semiconductor layer. The fifth element is a drain. The drain is an electrical conductor. The drain is in electrical contact with the second end of the semiconductor layer. A negative voltage bias applied to the gate causes the formation of a hole conduction channel in the semiconductor layer connecting the source to the drain. A positive bias applied to the gate causes the formation of an electron-conducting channel in the semiconductor layer.

As with electroluminiscent devices, the polymer films comprising the semiconductor layer may be formed by solvent-based processing techniques such as spin-coating, roller-coating, dip-coating, spray-coating and doctor-blading and ink jet printing. When two or more polymers are used, they may be deposited separately as distinct layers or deposited as one layer from a solution containing a blend of the desired polymers.

Two electrodes (source and drain) are attached to the semiconducting polymer and a third electrode (gate) onto the opposite surface of the insulator. If the semiconducting polymer is hole transporting (i.e, the majority carriers are positive holes), then applying a negative DC voltage to the gate electrode induces an accumulation of holes near the polymer-insulator interface, creating a conduction channel through which electric current can flow between the source and the drain. The transistor is in the "on" state. Reversing the gate voltage causes a depletion of holes in the accumulation zone and cessation of current. The transistor is in the "off" state.

EXAMPLES

The following examples are included for illustrative purposes only and do not limit the scope of the claims.

Example 1

Synthesis of Tricylic Arylamine Units

Scheme 1
Synthesis of N-(4-butylphenyl)phenothiazine and phenoxazine compounds

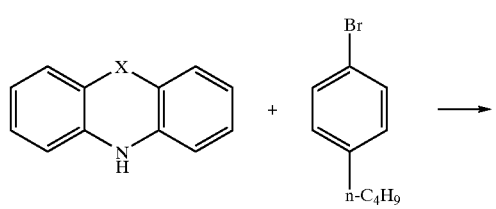

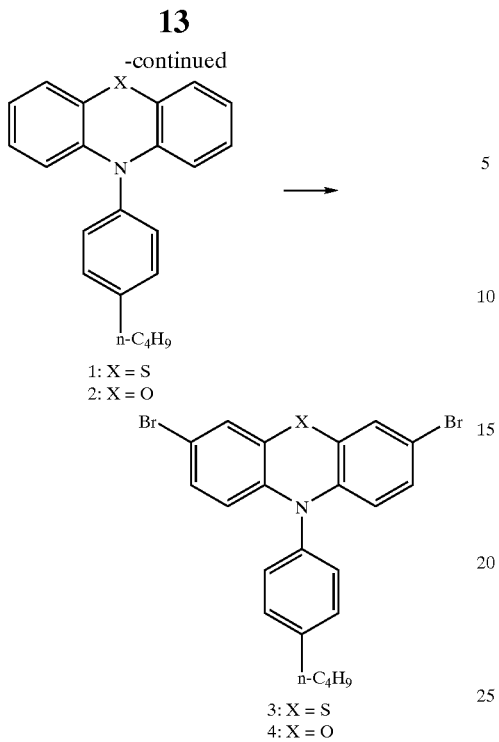

1: X = S
2: X = O

3: X = S
4: X = O a) Pd(OCOCH₃)₂, tri-o-tolylphosphine, t-BuO⁻Na⁺, toluene, reflux
b) N-bromosucciimide, CH₂Cl₂, 0° C.-r.t.

N-(4-n-Butylphenyl)phenothiazine (1: X=S)

A 2 L 3 neck round bottom flask equipped with overhead stirrer, reflux condensor and a nitrogen line was charged with 0.948 g (4.216 mmol) palladium acetate and 2.647 g (8.746 mmol) tri-o-tolylphosphine and 50 ml toluene. The mixture was stirred at ambient temperature for 20 minutes until an orange-red solution was formed. At that time, phenothiazine (19.93 g, 100 mmol), 1-bromo-4-butyl benzene (23.6 g, 110 mmol) and sodium t-butoxide (10.71 g, 100 mmol) along with 1000 mL toluene was added. The reaction was placed in an oil bath and heated to reflux for 15 hours. A sample was taken for HPLC showing that all starting material was gone. A major peak with the retention time of 8.6 minutes was seen. The solution was cooled. 15 mL concentrated HCl was added. The solution was stirred for an additional hour. Then the solution was passed through a neutral alumina column (750 g). The column was rinsed with toluene. The solvent was removed using a rotary evaporator to yield a yellow solid. The solid was recrystallized from toulene/MeOH. 19.6 g of white solid was obtained with 99% purity. The yield was 60.6%. MS: 331. $^1$H NMR (DMSO) δ0.92 (t, 3H), 1.36 (m, 2H), 1.62 (m, 2H), 2.73 (t, 2H), 6.13 (d, 2H), 6.87(m, 4H), 7.05 (d, 2H), 7.30 (d, 2H), 7.47 (d, 2H).

N-(4-n-Butylphenyl)phenoxazine (2: X=O)

This compound was prepared essentially according to the above procedure for preparation of 1. The crude product was recrystallized from toluene/MeOH and 8.1 g shiny white solid was obtained with ~100% purity. The yield was 51.24%.

3,7-Dibromo-N-(4-n-butylphenyl)phenothiazine (3: X=S)

A 500 mL three-necked round bottom flask equipped with overhead stirrer, reflux condensor and a nitrogen line was charged with 1(9.1 g, 27.5 mmol) and 140 mL methylene chloride. The solution was kept in an ice bath. To the stirring mixture, a solution of N-bromosuccinimide (10.26 g, 57.0 mmol) in 20 mL dimethyl foramide ("DMF") was added in drops through a syringe over a 10 minute period. The reaction mixture was brought to room temperature and allowed to stir for 2 hours. A sample was taken for HPLC showing all starting material (8.6 minute) were gone and a major peak with the retention time of 10.3 minutes was shown. The reaction mixture was washed three times with 2N HCl 200 mL, then washed with 200 mL water twice until the water layer turned to neutral. The organic portion was dried with Na₂SO₄. Na₂SO₄ was filtered out, and then the solution was passed through a neutral alumina column. The column was rinsed with toluene. The solvent was removed using a rotary evaporator to yield a light yellow solid with a purity of 96.7%. After three recrystallizations from hexanes, 5.6 g (41.2%) of a final product was obtained with a purity of 99.5%. MS: 487. $^1$H NMR (DMSO): δ0.95 (t, 3H), 1.36 (m, 2H), 1.62 (m, 2H), 2.75 (t, 2H), 5.97 (d, 2H), 7.08 (dd, 2H), 7.26 (m 4H), 7.48 (d, 2H).

3,7-Dibromo-N-(4-n-butylphenyl)phenoxazine (4: X=O)

This compound was prepared essentially according to the procedure for preparation of 3. The crude product was recrytallized from toluene/methanol, and 5.1 g of white shiny solid with a purity of 99.8% was obtained. The yield was 85%.

Example 2

Scheme 2
Synthesis of phenothiazine and phenoxazine compounds with a fluorine unit as a pendant group

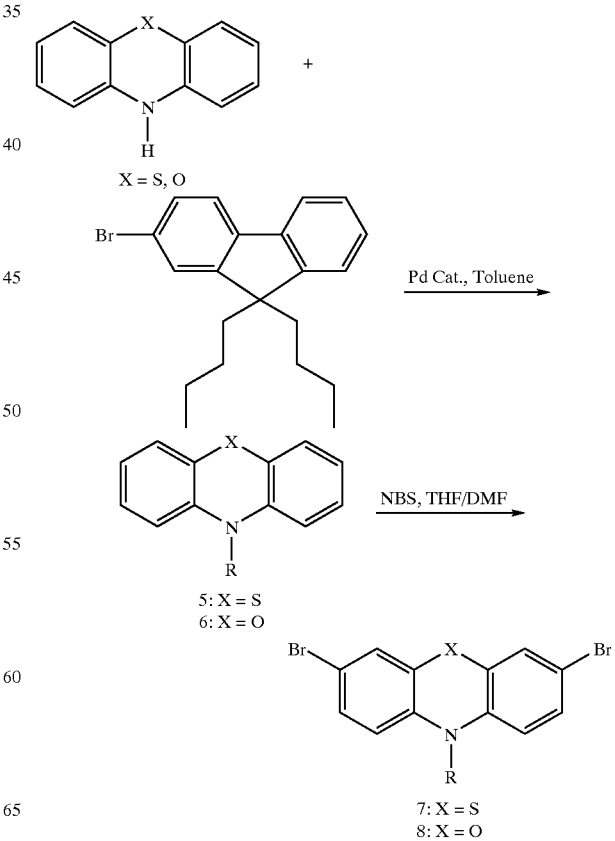

5: X = S
6: X = O

7: X = S
8: X = O

R =

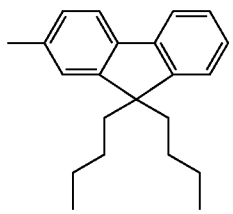

N-(9,9-Di-n-butylfluorene)phenothiazine (5: X=S)

A mixture of palladium acetate (180 mg, 0.81 mmol), tri-o-tolylphosphine (530 mg, 1.74 mmol) and toluene (12 mL) was stirred at ambient temperature for 30 minutes until a homogenous yellow solution was formed. The reaction mixture was covered under nitrogen. Phenothiazine (3.99 g, 20 mmol), 2-bromo-9,9-dibutylfluorene (7.85 g, 22 mmol), sodium tert-butoxide (2.88 g, 30 mmol) and more toluene (175 mL) was added to this mixture. The reaction vessel was placed into an oil-bath and heated to reflux overnight. HPLC showed that the reaction was incomplete. An additional 800 mg of 2-bromo-9,9-dibutylfluorene was added to the reaction flask. The mixture was refluxed for an additional 6 hours. The mixture was then cooled to ambient temperature, treated with hydrochloric acid (10 mL), passed through a column of neutral Alumina (Brockman Activity I) and eluted with toluene. The solvent was removed on a rotary evaporator under reduced pressure. The crude product was recrystallized from toluene/ethanol. Finally, 4.75 g (50%) of product was obtained. HPLC analysis indicated the product was in 98% purity. $^1$H NMR was consistent with the structure. $^1$H NMR (THF) δ8.02 (d, 1H), 7.82 (m, 1H), 7.5–7.3 (m, 5H), 6.98 (m, 2H), 6.79 (m, 4H), 6.25 (m, 2H), 2.07 (m, 4H), 1.12 (m, 4H), 0.69 (m, 10H).

N-(9,9-Di-n-butylfluorene)phenoxazine (6: X=O)

The compound was prepared essentially according to the procedure for synthesis of 5. Phenoxazine was used in place of phenothiazine. 14.9 g (64%) of product 6 was obtained. HPLC analysis indicated the product was in 98% purity. NMR was consistent with the structure. $^1$H NMR (THF) δ8.00 (d, 1H), 7.82 (m, 1H), 7.5–7.3 (m, 5H), 6.62 (m, 6H), 6.00 (m, 2H), 2.07 (m, 4H), 1.10 (m, 4H), 0.69 (m, 10H).

3,7-Dibromo-N-(9,9-di-n-butylfluorene)phenothiazine (7: X=S)

4.28 g (9 mmol) of 5, 40 mL of DMF and 40 mL of tetrahydrofuran ("THF") were charged to a 500 mL flask equipped with a stirring bar. The mixture was covered with nitrogen. To this mixture, 320 g (18 mmol) of NBS in 10 mL of DMF was slowly added at 0° C. The mixture was allowed to warm up to room temperature and stirred for 6 hours. 200 mL H$_2$O/EtOH (1:1) was added to reaction mixture. White solid was precipitated. The resulting mixture was filtered. The solid was washed with hot iso-propanol and CH$_3$CN. The crude product was recrystallized twice from CH$_2$Cl$_2$/CH$_3$CN. 2 g (35%) of product was obtained as light yellow solid. HPLC analysis indicated the product was in 99% purity. $^1$H NMR and mass spectroscopy were consistent with the structure. $^1$H NMR (THF) δ8.02 (d, 1H), 7.84 (m, 1H), 7.5–7.3 (m, 6H), 7.18 (m, 2H), 6.74 (m, 2H), 6.10 (m, 2H), 2.07 (m, 4H), 1.12 (m, 4H), 0.69 (m, 10H).

3,7-Dibromo-N-(9,9-di-n-butylfluorene)phenoxazine (8: X=O)

This compound was prepared essentially according to the procedure described for 7. Phenoxazine was used in place of phenothiazine. 12.2 g (66%) of product was obtained. HPLC analysis indicated the product was in 99% purity. NMR and mass spec were consistent with the structure. $^1$H NMR (THF) δ8.02 (d, 1H), 7.83 (m, 1H), 7.5–7.3 (m, 6H), 6.88 (m, 1H), 6.75 (m, 2H), 5.90 (d, 2H), 2.06 (m, 4H), 1.12 (m, 4H), 0.69 (m, 10H).

Example 3

Polymerization Procedure of Polymer 1-Blue Light Emitting Polymer 2,7-Bis(1,3,2-dioxaborolan-2-yl)-9,9-dihexylfluorene (3.554 g, 7.4857 mmol), 2,7-dibromo-9,9dihexylfluorene (3.074 g, 6.2381 mmol), 3,7-dibromo-N-(4-πbutylphenyl)phenothiazine (0.193 g, 0.3669 mmol), 2,7-dibromo-9,9-dibiphenylfluorene (0.231 g, 0.3669 mmol) and N,N'-bis(4-bromophenyl)-N,N'bis(4-n-butylphenyl)phenylenediamine (0.253 g, 0.3669 mmol), phase transfer reagent Aliquat 336® (1.21 g), tetrakis(triphenylphosphine)palladium (10.9 mg), and 50 mL toluene were added to a 250 mL three necked round bottom flask equipped with a stir shaft, glass stopper and reflux condensor. The solid was allowed to dissolve in toluene then 15.5 mL of a 2M Na$_2$CO$_3$ solution was added. The total volume of the mixture was 65.5 mL. The entire system was connected to a nitrogen line through the reflux condensor so that a dynamic blanket of nitrogen was over the solution throughout the duration of the reaction. All solids went into the solution in 4 hours and 5 minutes. Polymerization took 5 hours and 25 minutes at 100° C. The reaction was capped after polymerization by adding 0.202 g phenyl boronic acid followed by 20 mL toluene. After overnight stirring at 100° C., the reaction vessel was cooled to 84° C. and 3 g of diethyldithiocarbamic acid sodium salt trihydrate was added directly to the polymer solution followed by 30 mL of water. The reaction was allowed to stir for 5 hours and then was taken out of the oil bath and cooled. The polymer solution was transferred to a 2 L separatory funnel and allowed to sit for 15 minutes. After the water layer was separated from the polymer solution, the polymer solution was washed twice with 2% of acetic acid (100 mL) and twice with water (100 mL). The polymer solution was then passed through a column of celite, silica gel, basic alumina, and celite. The column was then eluted with warm toluene (2×volume of polymer solution). The isolated polymer was placed in a vacuum oven at 55° C. to dry overnight. The crude polymer was re-dissolved in toluene (3% wt/vol solution) and re-precipitated from excess methanol. The polymer was collected by filtration and dried in a vacuum oven at 55° C. overnight. Total polymer collected was: 3.95 g; $\eta_{inh}$=2.07 dL/g (THF, 25° C., 0.5 g/dL); Mw: 234,723; PDI (poly-dispersity indx): 3.182.

Polymerization Procedure of Polymer 2-Blue Light Emitting Polymer 9,9-Dihexylfluorene-2,7-boronicacid ethylene glycol ester (~99.9%, 3.518 g, 7.408 mmol), 2,7-dibromo-9,9-dihexylfluorene (~99.9%, 3.043 g, 6.174 mmol), N,N'-bis(4n-butylbenzene)-N,N'-bis(4-bromophenyl)-1,4-phenylenediamine(~98.8%, 0.251 g, 0.363 mmol), 3,7-dibromo-N-(9,9-di-n-butylfluorene)phenothiazinc (~99%, 0.233 g, 0.363 mmol), 2,7-dibromo-9,9-dibiphenylfluorene (~100%, 0.228 g, 0.363 mmol), toluene (50 mL), phase transfer agent, Aliquat 336®, (1.07 g, 2.600 mmol), tetrakis(triphenylphosphine)palladium (0) (7.6 mg, 0.007 mmol), and 2M aqueous sodium carbonate solution (15 mL) were placed in a 250 mL three-necked flask equipped with an overhead stirrer and condenser. The system was purged with nitrogen. The mixture was gently refluxed overnight. A viscous mixture was observed at the end of the polymerization. To terminate the polymerization, 0.2 g of benzene boronic acid (dissolved in 2 mL THF) and 50 mL of toluene was added, and the reaction was allowed to continue for 8 more hours. After cooling, the mixture was diluted with toluene and transferred to a separatory funnel. The aqueous phase was removed and the organic phase was washed with water. The toluene layer was then transferred to a 500 mL three-necked flask, and an aqueous solution of sodium diethyldithiocarbamate trihydrate (DDC, 3 g in 30 water) was added. The mixture was stirred at ~88° C. overnight. The aqueous layer was removed. The organic phase was washed with 2% AcOH and water, then passed through a column of celite, silica gel and basic alumina, and eluted with toluene. The eluates were concentrated with a rotary evaporator. The polymer was first precipitated from methanol/water and dried under vacuum at 45° C. The crude polymer was re-dissolved in toluene with heating and then precipitated from methanol. The polymer was filtered and washed with methanol. After drying under vacuum at 45° C. overnight, 3.8 g (76%) of polymer was obtained: $\eta_{inh}$=2.93 dL/g (THF, 25° C., 0.5 g/dL).

Polymerization Procedure of Polymer 3-Blue Light Emitting Polymer 9,9-Dioctylfluorene-2,7-boronicacid ethylene glycol ester (3.089 g, 5.8186 mmol), 3,7-dibromo-N-(4-n-butylphenyl) phenoxazine (0.545 g, 4.6088 mmol), 2,7-dibromo-9,9-di(4-hexyloxyphenyl)fluorene (3.134 g, 4.6088 mmol) and Aliquot 336® (1.14 g, 2.0619 mmol), and 35 mL toluene were added to a 250 mL three necked round bottom flask equipped with a stirring shaft, glass stopper and reflux condensor. The solid was allowed to dissolve in toluene and 14 mL of a 2M $Na_2CO_3$ solution was added. Then tetrakis(triphenylphosphine)palladium (6.9 mg, 0.0056 mmol) was added and rinsed with 15 mL of toluene. Next, the whole system was connected to a nitrogen line through the reflux condenser so that a dynamic blanket of nitrogen was over the solution throughout the duration of the reaction. The reaction was started by stirring. Due to the bending rod, stirring was not smooth and solid was splashed all over the flask. The stirring rod was replaced. Some of the solid was pushed down and stirred at 640 RPM at 110° C. After four hours and fifty minutes, some solid was refluxed down to the solution. A spatula was used to push some more solid down. About 35 mg of 9,9-dioctylfluorene-2,7-boronicacid ethylene glycol ester and 2 mg of tetrakis(triphenylphosphine)palladium and 10 mL of toluene was then added. The mixture was stirred at 700 RPM, 110° C. After thirty minutes, the reaction appeared to gel. The polymerization was capped by adding 0.52 g bromobenzene followed by 25 mL toluene and 40 mL THF. The color turned from brown to blue. The reaction was then stirred at 340 RPM, 110° C. then overnight. The next morning, the reaction was sampled by GPC. The Mw was 560,000. The reaction was capped with 0.58 g of phenyl boronic acid followed by 20 mL of tetrahydrofuran. The reaction was then stirred at 300 RPM. After 14 hrs of stirring at 105° C., the reaction vessel was cooled to 84° C. and 5 g of diethyldithiocarbamic acid sodium salt trihydrate was added directly to the polymer. 40 mL of water was then added. The reaction was allowed to stir overnight. After 100 mL of toluene was added, the reaction was taken out of the oil bath and cooled (the whole organic volume is 200 mL). The polymer solution was then transferred to a 2 L separatory funnel and allowed to sit for 15 minutes. After a water layer was separated from the polymer solution, the polymer solution was washed with 2% acetic acid (4×250 mL), water (4×250 mL) and then precipitated into 2.5 L of methanol. A fiber-like polymer was filtered out and dried overnight. The polymer was dissolved in 150 mL toluene then passed through basic aluminum oxide (3 inch)-silica gel (3 inch) column (The column was rinsed with 1 toluene before using.). The column was rinsed with 1.5 L toluene. The polymer precipitate was collected and dried on a rotor evaporator at 60° C. for an hour. It was then redissolved into 150 mL toluene and precipitated a third time into 2.5 L of methanol. The fiber-like polymer was dried in an oven overnight at 55° C. The total polymer collected was: 4.3 g; $\eta_{inh}$=2.52 dL/g (THF, 25° C., 0.5g/dL); Mw: 669,000; PDI (poly-dispersity index): 3.40

Polymerization Procedure of Polymer 4-Blue Light Emitting Polymer

A 500 mL, three-necked, round bottom flask, equipped with an overhead stirrer and a reflux condenser which is connected to a nitrogen line, was charged with 2,7-bis(1,3,2-dioxaborolan-2-yl)-9,9-dihexylfluorene (6.037 g, 12.73 mmol, 2 mol % excess), 2,7-dibromo-9,9-dihexylfluorene (4.914 g, 9.98 mmol), POZ, (0.591 g, 1.25 mmol), 1,4-dibromo-2,5-difluorobenzene (0.339 g, 1.25 mmol), phase-transferring reagent Aliquat 336 (1.5 g) and toluene (125 mL). The mixture was stirred until a homogenous solution was observed. To the solution aqueous sodium carbonate (2 M, 30 mL) was added and the system was stirred and purged with nitrogen for 10 min. Tetrakis(triphenylphosphine) palladium (14.7 mg, 0.1 mol %) was added and the reaction was stirred and heated in an oil-bath at 95° C. for 6 hours resulting in a very viscous yellow mixture. The mixture was diluted with 100 mL of toluene, and 1.0 g of phenyl boronic acid dissolved in 15 mL of THF was added and the mixture was stirred overnight. The mixture was diluted with 250 mL of toluene, transferred to a 1 L flask, and stirred with an aqueous solution of diethyldithiocarbamic acid sodium salt trihydrate (15 g/300 mL) at 80° C. for 24 hours. The aqueous layer was separated and the toluene layer was washed with hot dilute acetic acid (2%, 3×300 mL) and warm water (1×300 mL). The polymer was precipitated from methanol (3.0 L), collected by filtration, and washed with methanol. The product was transferred to a 2 L round bottom flask, and the remaining methanol was removed by vacuum on a rotary evaporator. The solid was dissolved in 800 mL of toluene and passed through a column tightly packed with silica gel (4×8 cm), basic alumina (1×8 cm) and topped with filter paper. The polymer containing fractions were collected and the volume was reduced to ~400 mL. The polymer was precipitated from methanol and washed with methanol. The dissolving, precipitation process was performed one more time and the polymer was dried in a vacuum oven overnight to yield 6.3 g (79%) of a light yellow fibrous material. $\eta_{inh}$=2.15 dL/g (THF, 25° C., 0.5 g/dL), Mw 250,900, Mn 92,800, PDI (polydispersity index): 2.7; Tg=117.64° C.

Polymerization Procedure of Polymer 5-Yellow Light Emitting Polymer

A 250 mL, three-necked, round bottom flask equipped with an overhead stirrer and a reflux condenser connected to a nitrogen line was charged with 2,7-bis(1,3,2-dioxaborloan-2-yl)-9,9-dioctylfluorene (99.7%, 7.26 mmol, 3.864 g), 4,7-dibromo-2,1,3-benzothiadiazole (99.8%, 5.69 mmol, 1.678 g), 3,7-dibromo-N-(4-n-butyl phenyl)phenothiazine (99.0%, 1.42 mmol, 0.704 g), aqueous sodium carbonate (2M, 15 mL), phase-transferring reagent Aliquat 336® (1 g, Aldrich), tetrakis(triphenylphospine)palladium catalyst (7.7 mg, 0.10 mol %, Strem) and toluene (40 mL, Fisher HPLC Grade). The reaction was stirred and heated to reflux in an oil bath at 105° C. for 15 hours. Ten mL toluene was added and the reaction heated for an additional hour. An orange viscous solution was observed. At this time, phenylboronic acid (0.6 g, Aldrich), toluene (10 mL) and THF (10 mL) were added and the stirring was continued for an additional 8 hours at 93° C. After cooling to about 60° C., the organic layer was separated and washed with water (2×100 mL). The solution was then stirred with an aqueous solution of diethyldithiocarbamic acid sodium salt trihydrate (5%, 60 mL) at 82° C. for 18 hours. After cooling, the aqueous phase was separated and the organic solution was washed with 2% of acetic acid (3×200 mL) and water (2×200 mL). The organic layer was passed through a tightly packed column of celite (1")-alumina, basic (1")-silica gel (3")-celite (1") eluted with toluene. (The column had been eluted with 1 L toluene before using.) The polymer containing fractions were collected and the volume of solution was concentrated by rotary evaporation to ~100 mL. The polymer was precipitated from methanol/water (2 L/100 mL), collected by filtration and dried for 4 hours in a vacuum oven at 55° C. The polymer was redissolved in toluene (150 mL) and precipitated from methanol (2 L). The product was collected, washed with methanol and dried overnight in a vacuum oven at 55° C. to yield an orange-yellow fibrous material. 3.2 g (80%) of polymer was obtained: $\eta_{inh}$=1.31 dL/g (THF, 25° C., 0.5 g/dL); Mw: 143,000; PDI (poly-dispersity index): 2; DSC measurements revealed a Tg of 129° C.

Polymerization Procedure of Polymer 6-Red Light Emitting Polymer

A 250 mL, three-necked, round bottom flask equipped with an overhead stirrer and a reflux condenser connected to a nitrogen line was charged with 2,7-bis(1,3,2-dioxaborloan-2-yl)-9,9-dioctylfluorene (99.7%, 6,59 mmol, 3.506 g), 4,7-dibromo-2, 1,3-benzothiadiazole (99.8%, 3.83 mmol, 1.128 g), 3,7-dibromo-N-(4-n-butyl phenyl)phenothiazine (99.0%, 0.479 mmol, 0.236 g), 2,7-dibromo-9,9-dioctylfluorene (100%, 1.915 mmol, 1.049 g), 4,7-bis(2-bromo-5-thiophenyl) benzothiadiazole (99.4%, 0.2394 mmol, 0.111 g), aqueous sodium carbonate (2 M, 14 mL), phase-transferring reagent Aliquat 336® (0.95 g, Aldrich), tetrakis (triphenylphospine)palladium catalyst (7.4 mg, 0.10 mol %, Strem) and toluene (40 mL, Fisher HPLC Grade). The reaction was stirred and heated to reflux in an oil bath at 102° C. for 15 hours. Twenty mL toluene was added and the reaction heated for an additional hour and forty five minutes. A red-orange viscous solution was observed. At this time, phenylboronic acid (0.68 g, Aldrich) and THF (20 mL) were added and the stirring was continued for an additional 8 hours at 93° C. After cooling to about 60° C., the organic layer was separated and washed with water (2×100 mL). The solution was then stirred with an aqueous solution of diethyldithiocarbamic acid sodium salt trihydrate (5%, 60 mL) at 81° C. for 18 hours. After cooling, the aqueous phase was separated and the organic solution was washed with 2% of acetic acid (3×200 mL) and water (2×200 mL). The organic layer was passed through a tightly packed column of celite (1")-alumina, basic (1") -silica gel (3")-celite (1") eluted with toluene. (The column had been eluted with 1 L toluene before using.) The polymer containing fractions were collected and the volume of solution was concentrated by rotary evaporation to approximately 150 mL. The polymer was precipitated from methanol/water (2 L/100 mL), collected by filtration and dried for 4 hours in a vacuum oven at 55° C. The polymer was redissolved in toluene (150 mL) and precipitated from methanol (2 L). The product was collected, washed with methanol and dried overnight in a vacuum oven at 55° C. to yield an orange-red fibrous material. 3.31 g (83%) of polymer was obtained: $\eta_{inh}$=2.35 dug (THF, 25° C., 0.5 g/dL); Mw: 333,000; PDI (poly-dispersity index): 2.58; DSC measurements revealed a Tg of 106 deg Celcius.

Polymerization Procedure of Polymer 7-Green Light Emitting Polymer

A 500 mL, three-necked, round bottom flask, equipped with an overhead stirrer and a reflux condenser connected to a nitrogen line was charged with 2,7-bis(1,3,2-dioxaborloan-2-yl)-9,9-dioctylfluorene (1.84 g, 3.44 mmol), (1.01 g, 3.44 mmol), aqueous sodium carbonate (2 M, 5.0 mL), DI water (3.0 mL), phase-transferring reagent Aliquat 336® (0.3 g), tetrakis(triphenylphosphine)palladium (3.0 mg), and toluene (40 mL). The reaction was stirred and heated in an oil-bath at 95° C. for 16 hours. A red-orange solution was observed. The reaction was charged with 2,7-bis(1,3,2-dioxaborloan-2-yl)-9,9-dihexylfluorene (7.43 g, 15.7 mmol), 2,7-dibromo-9,9-dihexylfluorene (5.78 g, 11.73 mmol), and N-(4butylphenyl) -3,7-dibromophenothiazine (1.78 g, 3.63 mmol), aqueous sodium carbonate (2 M, 31 mL), phase-transferring reagent Aliquat 336 (2.5 g), and tetrakis (triphenylphosphine)palladium (14 mg) and toluene (100 mL). The reaction was allowed to run for 8 hours and a very viscous material was observed. Bromobenzene (0.32 g) and toluene (50 mL) were added. Stirring was continued for 4 hours. Phenylboronic acid (1.22 g) was then added and the stirring was continued for another 14 hours. After cooling, the mixture was diluted with toluene (200 mL) and transferred into a 2 L three-necked round bottom flask. The aqueous layer was separated and the organic layer was transferred to a 3-necked round bottom flask. The solution was then stirred with an aqueous solution of diethyldithiocarbamic acid sodium salt trihydate (5%, 250 mL) at 80° C. for 8 hours. After cooling, the aqueous phase was separated, and the organic solution was washed with water (3×300 mL), then with 1% of AcOH (3×300 mL). The water residue was azeotroped by rotary evaporation. The volume of the solution was adjusted to 350 mL and the polymer was precipitated from methanol (3 L) and collected by filtration. The crude polymer was dissolved in toluene (500 mL) with gentle heating. The solution was then passed through a silicon gel column eluted with toluene. The polymer containing fractions were collected, the volume of the solution was concentrated to 350 mL. The polymer was precipitated from methanol (3 L) and collected by filtration. The polymer was redissolved in toluene (300 mL) and precipitated again from methanol (3 L). The product was washed with methanol and dried in a vacuum oven at 60° C. overnight to give a yellow fibrous material, 11.88 g (99%). Inherent viscosity $\eta_{inh}$=3.52 dL/g (THF, 25° C., 0.5 g/dL), Tg=120.30° C.

Polymerization Procedure of Polymer 8-White Light Emitting Polymer

To a 1-liter, 3-necked round bottom flask equipped with reflux condenser and an overhead stirrer, the following monomers were added: 9,9-dioctylfluorene-2,7-boronicacid ethylene glycol ester (13.627 g, 25.692 mmol), 2,7-dibromo-9,9-dioctylfluorene (12.403 g, 22.615 mmol), 3,7-dibromo-N-(4-n-butylphenyl)phenoxazine (0.595 g, 1.256 mmol), 4,7-dibromo-2,1,3-benzothiadiazole (8.2 mg, 0.028 mmol), 4,7-bis(5-bromo-2-thienyl)-2,1,3-benzothiadiazole (1.2 mg, 0.003 mmol) N,N'-di(4-bromophenyl)N,N'-bis-(9,9-dibutyl) fluorene-1,4-phenylenediamine (1.220 g, 1.256 mmol) and bis(4-bromophenyl)-4-methylphenylamine (1.1 mg, 0.003 mmol). A 0.74 M solution of Aliquat 336® in toluene (10.8 mL) was added, followed by 190 mL of toluene. After addition of the Pd(PPh$_3$)$_4$ catalyst, the mixture was stirred for about fifteen minutes in an oil bath (105° C.) until all of the monomer was dissolved. An aqueous solution of sodium carbonate (2.0 M, 48 mL) was added and the reaction was stirred in an oil bath (105° C.) for 16.5 hours. Phenyl boronic acid (1.0 g) was then added and the reaction stirred for 7 hours. The aqueous layer was removed and the organic layer was washed with water (100 mL). The organic layer was placed back in the reaction flask, and 5.0 g of sodium diethylditho-carbamate and 50 mL water was added. The reaction was stirred in an oil bath (85° C.) for 16 hours. The aqueous layer was removed, the organic layer was washed with water (3×100 ml), then passed through a column of silica gel and basic alumina. The toluene/polymer solution was then precipitated into methanol (twice), and the polymer dried under vacuum at 60° C. Yield =10.37 g (56.1%) $M_w$=167,000; $M_w/M_n$=2.4

Polymerization Procedure of Polymer 9-White Light Emitting Polymer

To a 1-liter, three-necked round bottom flask equipped with reflux condenser and an overhead stirrer, the following monomers were added: 9,9-dioctylfluorene-2,7-boronicacid ethylene glycol ester (3.541 g, 6.677 mmol), 2,7-dibromo-9,9-dioctylfluorene (2.7786 g, 5.066 mmol), 3,7-dibromo-N-(4-n-butylphenyl)-phenothiazine (0.6969 g, 1.473 mmol), 4,7-bis(5-bromo-2-thienyl)-2,1,3-benzothiadiazole (3.0 mg, 0.007 mmol). A 0.74M solution of Aliquat 336® ) in toluene (2.9 mL) was added, followed by 100 mL of toluene. After addition of the $Pd(PPh_3)_4$ catalyst (7.6 mg), the mixture was stirred for about fifteen minutes in an oil bath (105° C.) until all of the monomer was dissolved. An aqueous solution of sodium carbonate (2.0 M, 13 mL) was added and the reaction was stirred in an oil bath (105° C.) for 22 hours. Phenyl boronic acid (0.5 g) was then added and the reaction stirred for 7 hours. The aqueous layer was removed and the organic layer was washed with water (100 mL). The organic layer was placed back in the reaction flask, and 2.0 g of sodium diethyldithiocarbamate and 50 mL water was added. The reaction was stirred in an oil bath (85° C.) for 15 hours. The aqueous layer was removed, the organic layer was washed with water (3×100 ml), then passed through a column of silica gel and basic alumina. The toluene/polymer solution was then precipitated into methanol (twice), and the polymer dried under vacuum at 60° C. Yield =3.01 g (60.2%) $M_w$=80,445; $M_w/M_n$=2.4

Electroluminescent Device Fabrication and Performance

Electroluminescent devices were prepared by the following procedures: ITO (indium tin oxide)-coated glass substrates were cleaned, coated with polyethylene dioxythiophene (PEDOT) and appropriate xylene solutions of emitting polymers. After drying, the cathode metal (calcium) was vapor deposited over the luminescent polymer film.

Device operational parameters at a brightness of 1000 $Cd/m^2$ are tabulated in Table 1, together with a measure of light efficiency, Cd/A, obtained according to the formula L/(10J) where L is 1000 $Cd/m^2$. Bias voltage (V) is the voltage at which a brightness of 1000 $Cd/m^2$ is attained; similarly current density (J) is the current per unit area of the device at 1000 $Cd/m^2$, and is given in $mA/cm^2$. The maximum brightness in $Cd/m^2$, efficiency and CIE (1931) color coordinates are presented in Table 2.

Tables 3, 4, 5 and 6 compare the current density of devices containing polymers of the invention with devices containing similar polymers with repeat units of triarylamines rather than the tricyclic amines. The data presented in Tables 3, 4, 5 and 6 demonstrate that the polymers comprising tricyclic arylamines in a repeat unit are more conductive and improved device efficiency compared to polymers which include triaryl amines but do not contain tricyclic aryl amines.

As a convention, the polymers depicted in Tables 3, 4, 5 and 6 show a fluorene unit bonded to another conjugated moiety. This convention should be taken to mean that a fluorene based moiety is present on both sides of any conjugated moiety shown as part of a repeat unit.

TABLE 1

EL performance data
(ITO/PEDOT/luminescent polymer/Ca/Al) @ brightness of 1000 $Cd/m^2$

| Polymer examples | Voltage (V) | Current Density J (mA/cm2) | Light Efficiency (Cd/A) |
| --- | --- | --- | --- |
| Polymer 1 (Blue) | 9.67 | 33.80 | 2.98 |
| Polymer 2 (Blue) | 9.50 | 32.65 | 3.01 |
| Polymer 3 (Blue) | 7.07 | 67.04 | 1.53 |
| Polymer 4 (Blue) | 8.22 | 93.50 | 1.09 |
| Polymer 5 (Yellow) | 7.97 | 218.1 | 0.46 |
| Polymer 6 (Red) | 8.75 | 199.9 | 0.50 |
| Polymer 7 (Green) | 4.51 | 38.61 | 2.59 |
| Polymer 8 (White) | 8.15 | 23.78 | 4.21 |
| Polymer 9 (White) | 9.8 | 176 | 0.56 |

TABLE 2

| Polymers | Max Brightness ($Cd/m^2$) | Efficiency (Cd/A @ 200 $Cd/m^2$) | Color Coordinates CIE (1931) (X, Y) |
| --- | --- | --- | --- |
| Polymer 1 | 9179 | 3.11 | 0.18, 0.34 |
| Polymer 2 | 9952 | 3.00 | 0.17, 0.31 |
| Polymer 3 | 8909 | 0.96 | 0.15, 0.21 |
| Polymer 4 | 5916 | 0.68 | 0.15, 0.18 |
| Polymer 5 | 1445 | 0.47 | 0.54, 0.46 |
| Polymer 6 | 1580 | 0.68 | 0.67, 0.33 |
| Polymer 7 | 12957 | 2.19 | 0.42, 0.56 |
| Polymer 8 | 15,600 | 3.9 | 0.26, 0.36 |
| Polymer 9 | 2,400 | 0.38 | 0.31, 0.38 |

TABLE 3
| Polymers | Current Density ma/cm2 @ 8 V | Current Density ma/cm2 @ 10 V |
|---|---|---|
| 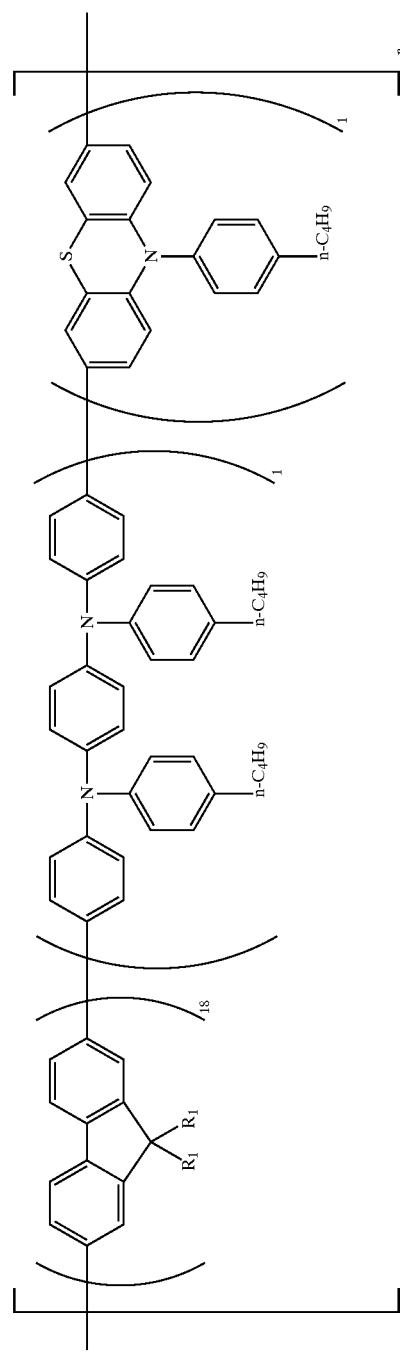<br>R₁ = Hexyl or Biphenyl | 29.8 | 104.1 |
| 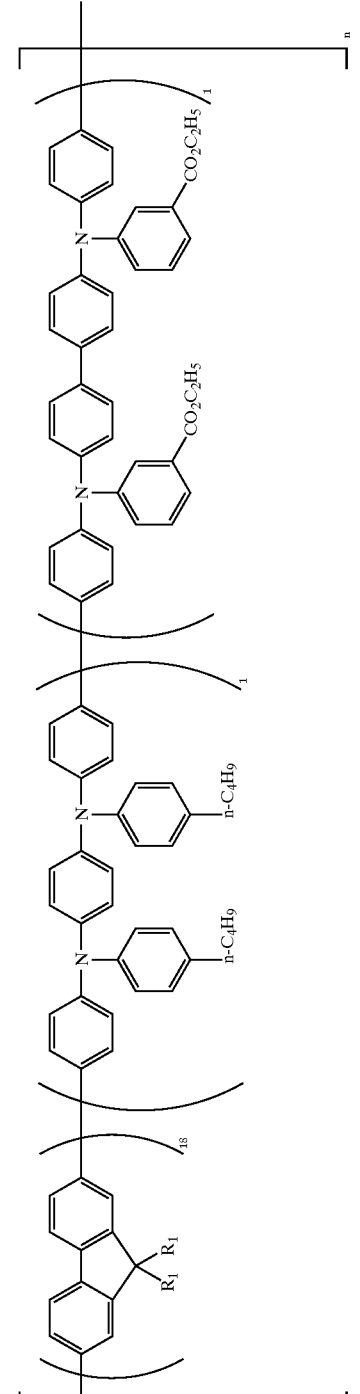<br>R₁ = Hexyl or Biphenyl | 8.0 | 44.3 |

TABLE 4

| Polymers | Current Density ma/cm2 @ 8 V | Current Density ma/cm2 @ 10 V |
| --- | --- | --- |
| ![polymer structure with phenoxazine, triarylamine and fluorene units, R₁ = Octyl] | 27.6 | 91.0 |
| ![polymer structure with triarylamine and fluorene units, R₁ = Octyl] | 2.3 | 11.8 |

TABLE 5
| Polymers | Current Density ma/cm2 @ 8 V | Current Density ma/cm2 @ 10 V |
|---|---|---|
| 27 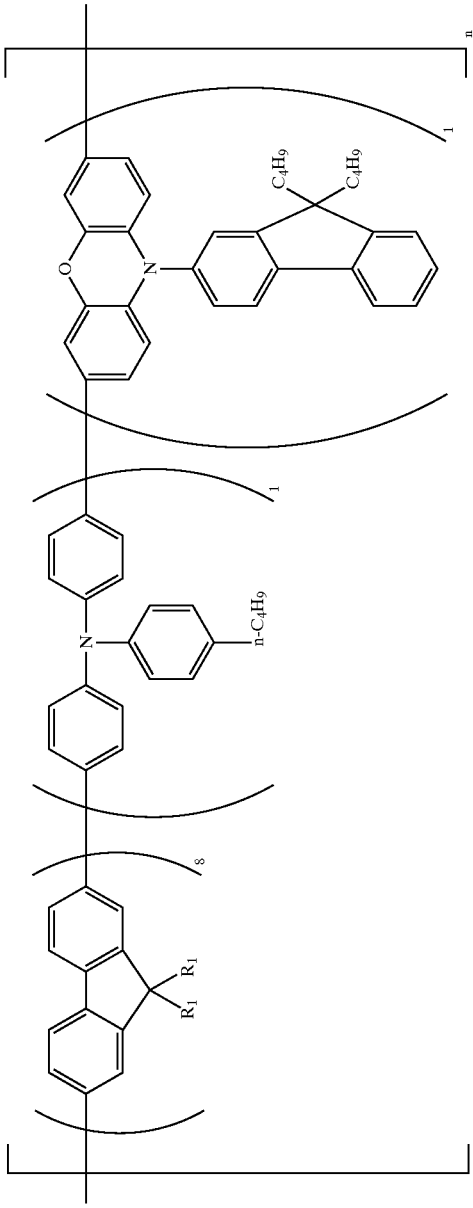 R₁ = Octyl or Phenyl | 68.7 | 194.9 |
| 28 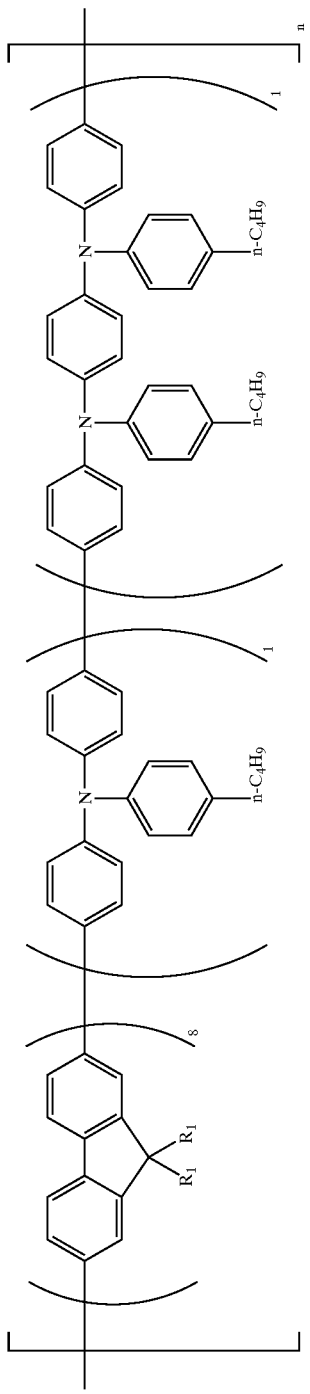 R₁ = Octyl or Phenyl | 47.0 | 126.0 |

TABLE 6
| Polymers | Current Density ma/cm2 @ 8 V | Current Density ma/cm2 @ 10 V |
| --- | --- | --- |
| 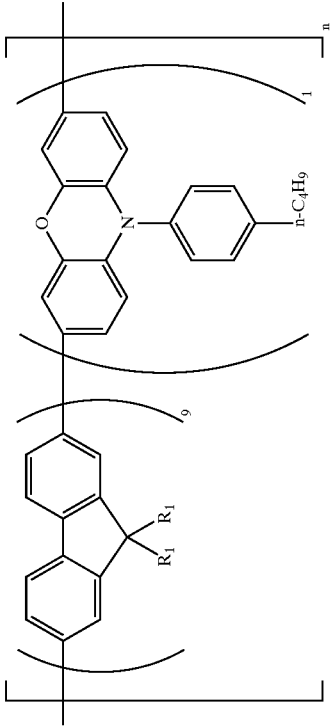 R₁ = Octyl | 194.9 | 332.0 |
| 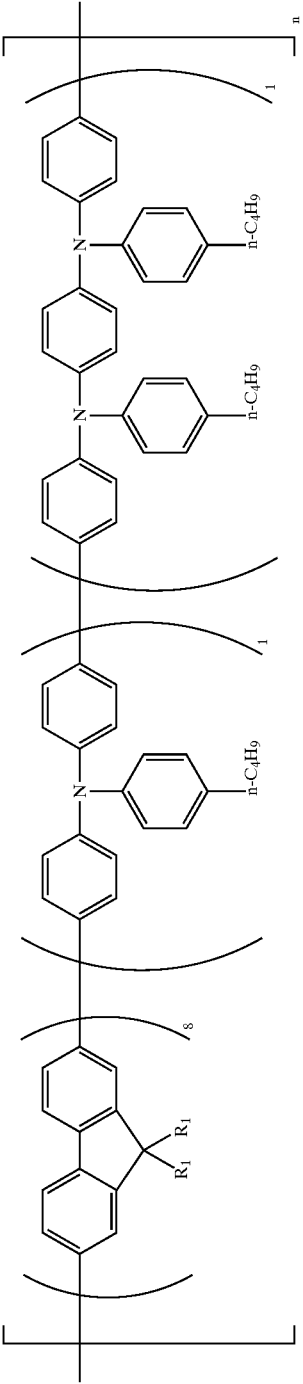 R₁ = Octyl or Phenyl | 46.0 | 131.7 |

TABLE 6-continued
| Polymers | Current Density ma/cm2 @ 8 V | Current Density ma/cm2 @ 10 V |
|---|---|---|
| 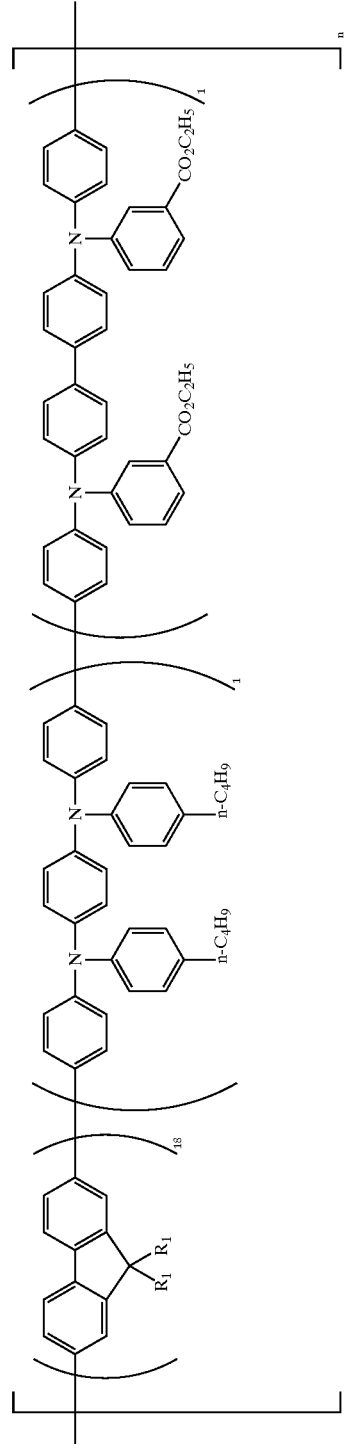 | 8.0 | 44.3 |
R₁ = Hexyl or Biphenyl

What is claimed is:

1. A composition comprising a polymer having a repeat unit of the formula:

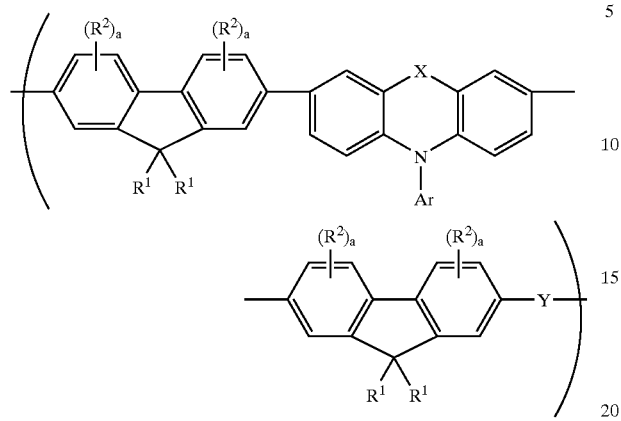

and additional optional repeat units of the formula

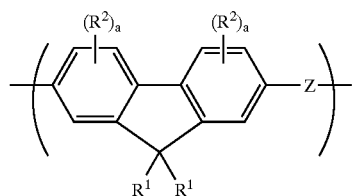

wherein $R^1$ is independently, in each occurrence H, $C_{1-40}$ hydrocarbyl or $C_{3-40}$ hydrocarbyl containing one or more S, N, O, P or Si atoms, or both of $R^1$ together with the 9-carbon on the fluorene may form a $C_{5-20}$ ring structure containing one or more S, N, or O atoms;

$R^2$ is independently in each occurrence $C_{1-20}$ hydrocarbyl, $C_{1-20}$ hydrocarbyloxy, thioether, $C_{1-20}$ hydrocarbyloxycarbonyl, $C_{1-20}$ hydrocarbylcarbonyloxy, or cyano;

a is independently, in each occurrence 0 or 1;

X is O, S, $SO_2$, $C(R^3)_2$ or N—$R^3$ wherein $R^3$ is aryl of $C_6$ to $C_{40}$ or substituted aryl of $C_6$ to $C_{40}$, aralkyl of $C_6$ to $C_{24}$, or alkyl of $C_1$ to $C_{24}$.

Ar is an aryl or heteroaryl group of $C_6$ to $C_{40}$ or substituted aryl or heteroaryl group of $C_6$ to $C_{40}$; and Y and Z are independently in each occurrence selected from the group of conjugated unit of the formulas:

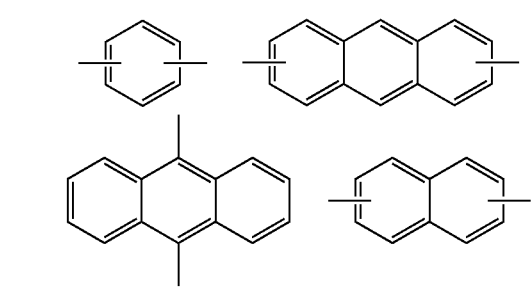

-continued

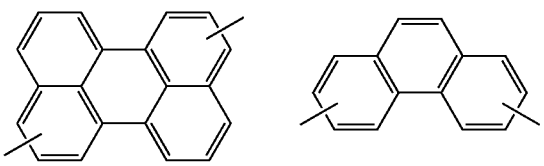

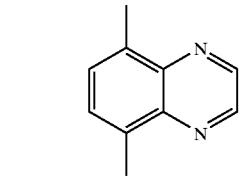

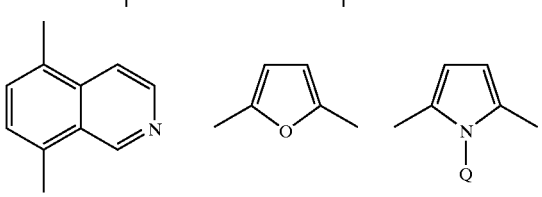

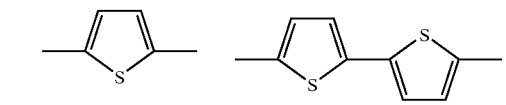

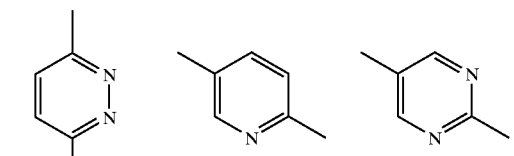

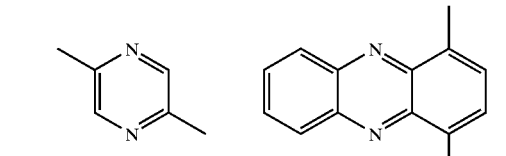

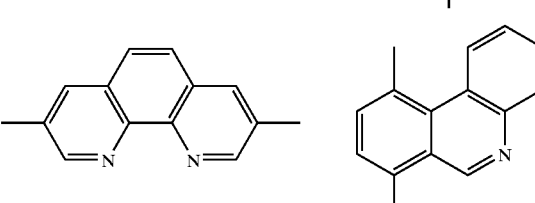

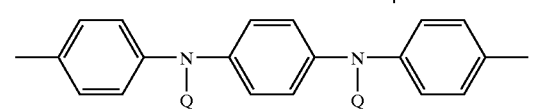

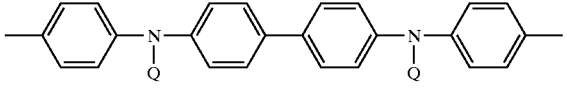

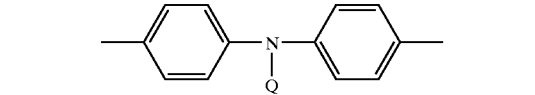

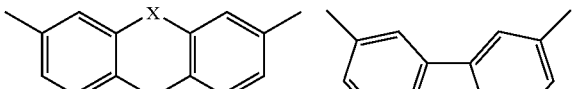

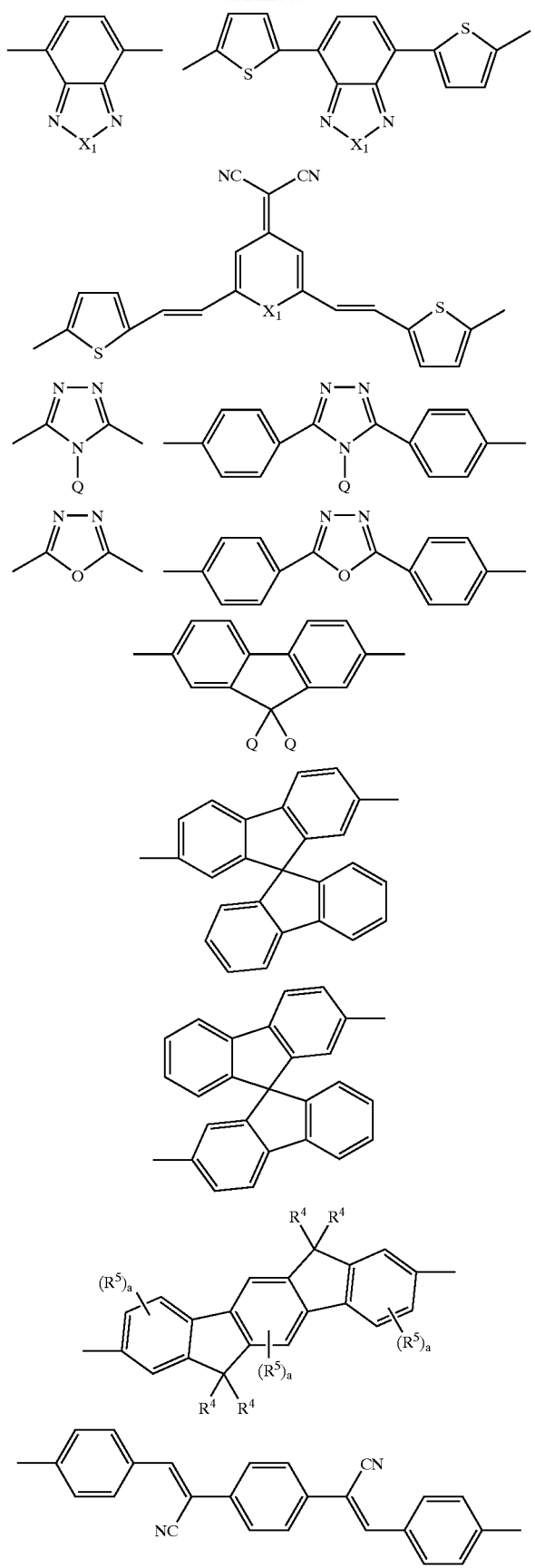

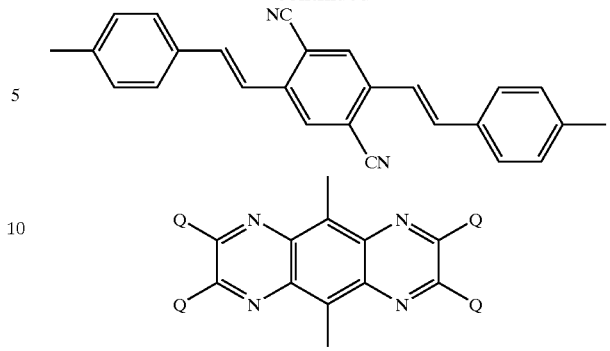

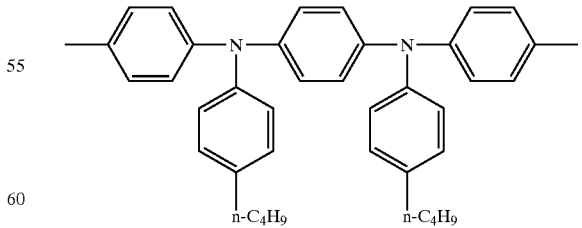

wherein the conjugated units may bear substituents, such substituents being independently in each occurrence $C_{1-20}$ hydrocarbyl, $C_{1-20}$ hydrocarboxyloxy, $C_{1-20}$ thioether, $C_{1-20}$ hydrocarbyloxycarbonyl, $C_{1-20}$ hydrocarboxy carbonyloxy cyano, or fluoro group;

$X_1$ is O or S;

Q is R or Ar;

R is $C_1$ to $C_{20}$;

Ar is an aryl or heteroaryl group of $C_6$ to $C_{40}$ or substituted aryl or heteroaryl group of $C_6$ to $C_{40}$; $R^4$ is independently, in each occurrence H, $C_{1-40}$ hydrocarbyl or $C_{3-40}$ hydrocarbyl containing one or more S, N, O, P or Si atoms, or both of $R^4$ together with the 9-carbon on the fluorene may form a $C_{5-20}$ ring structure containing one or more S, N, or O atoms and $R^5$ is independently in each occurrence $C_{1-20}$ hydrocarbyl, $C_{1-20}$ hydrocarbyl, $C_{1-20}$ hydrocarbyloxy, thioether, $C_{1-20}$ hydrocarbyloxycarbonyl, $C_{1-20}$ hydrocarbylcarbonloxy, or cyano.

2. The composition of claim 1 further comprising a solvent.

3. A film comprising the composition of claim 2.

4. The composition of claim 1 blended with at least one additional conjugated polymer.

5. The composition of claim 1 wherein the composition emits light in the blue range of the spectrum.

6. The composition of claim 1 wherein the composition emits light in the red range of the spectrum.

7. The composition of claim 1 wherein the composition emits light in the yellow range of the spectrum.

8. The composition of claim 1 wherein the composition emits light in the green range of the spectrum.

9. The composition of claim 1 wherein the composition emits white light.

10. The blue emitting composition of claim 5 wherein $R^1$ is hexyl or biphenyl, X is S or O, Ar is 4-n-butylphenyl and Z has the formula:

11. The composition of claim 10 wherein Ar is (9,9-dibutyl)-2-fluorenyl.

12. The blue emitting composition of claim 5 wherein $R^1$ is octyl or 4-hexyloxyphenyl, a is 0; X is O, Ar is 4-n-butylphenyl.

13. The red emitting composition of claim 6 wherein $R^1$ is $C_8H_{17}$, X is S, Ar is n-butylphenyl, Y is in at least one occurrence benzothiadiazole and Z is in at least one occurrence dithiophenebenzothiadiazole.

14. The yellow emitting composition of claim 7 wherein $R^1$ is $C_6H_5$ or $C_8H_{17}$, Ar is 4-n-butylphenyl, a is 0, X is S, and Y is benzothiadiazole.

15. The green emitting composition of claim 8 wherein $R^1$ is hexyl or octyl, X is S, Ar is n-butylphenyl, a is 0 and Y is benzothiadiazole.

16. The white emitting composition of claim 9 wherein $R^1$ is $C_8H_{17}$, X is O, a is 0 and Y is at least in one occurrence benzothiadiazole, bisthienylbenzothiadiazole and a triarylamine with the structure:

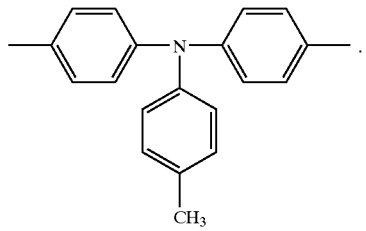

17. The white emitting composition of claim 9 wherein $R^1$ is $C_8H_{17}$, X is S, a is 0 and Y is bisthienylbenzothiadiazole.

18. An electroluminescent device comprising at least one organic film comprising the composition of claim 1, arranged between an anode material and a cathode material such that under an applied voltage, the organic film emits visible light which is transmitted through a transparent exterior portion of the device.

19. The device of claim 18 with a turn-on voltage of 20 volts or less.

20. A field effect transistor comprising:
(a) an insulator layer, the insulator layer being an electrical insulator, the insulator layer having a first side and a second side;
(b) a gate, the gate being an electrical conductor, the gate being positioned adjacent the first side of the insulator layer;
(c) a semiconductor layer, the semiconductor layer comprising the composition of claim 1 and a second electrode;
(d) a source, the source being an electrical conductor, the source being in electrical contact with the first end of the semiconductor layer; and
(e) a drain, the drain being an electrical conductor, the drain being in electrical contact with the second end of the semiconductor layer.

21. A photocell comprising a first electrode, a film comprising the polymer of claim 1 and a second electrode.

22. An optoelectronically active polymer which is the reaction product of a mixture comprising a diboronate fluorene monomer, a dihalogenated tricyclic amine monomer and optionally a conjugated monomer.

23. A composition of the formula

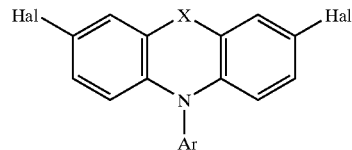

wherein X is O, S, $SO_2$, $C(R^3)_2$ or $N-R^3$ wherein $R^3$ is aryl of $C_6$ to $C_{40}$ or substituted aryl of $C_6$ to $C_{40}$, aralkyl of $C_6$ to $C_{24}$, or alkyl of $C_1$ to $C_{24}$. and Ar is a heteroaryl group or a substituted heteroaryl group of $C_6$ to $C_{40}$ or is selected from the group consisting of 4-n-butylphenyl, 2-fluorenyl, anthracenyl, phenanthrenyl, and pyrenyl; and Hal is a halogen.

24. The composition of claim 23 wherein Hal is Br.

* * * * *